US010515948B2

(12) United States Patent
Wen et al.

(10) Patent No.: US 10,515,948 B2
(45) Date of Patent: Dec. 24, 2019

(54) SEMICONDUCTOR DEVICE INCLUDING VERTICAL ROUTING STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Wei-Chih Wen, Hsinchu (TW); Han-Ting Tsai, Kaoshiung (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/941,716

(22) Filed: Mar. 30, 2018

(65) Prior Publication Data

US 2019/0148366 A1   May 16, 2019

Related U.S. Application Data

(60) Provisional application No. 62/586,726, filed on Nov. 15, 2017.

(51) Int. Cl.
| | |
|---|---|
| *H01L 27/06* | (2006.01) |
| *H01L 21/822* | (2006.01) |
| *H01L 21/768* | (2006.01) |
| *H01L 27/22* | (2006.01) |
| *H01L 23/525* | (2006.01) |
| *H01L 23/522* | (2006.01) |
| *H01L 27/24* | (2006.01) |
| *H01L 45/00* | (2006.01) |

(Continued)

(52) U.S. Cl.
CPC .... *H01L 27/0688* (2013.01); *H01L 21/76816* (2013.01); *H01L 21/76843* (2013.01); *H01L 21/76877* (2013.01); *H01L 21/8221* (2013.01); *H01L 23/525* (2013.01); *H01L 23/5226* (2013.01); *H01L 27/228* (2013.01); *H01L 27/2436* (2013.01); *H01L 43/12* (2013.01); *H01L 45/04* (2013.01); *H01L 45/06* (2013.01); *H01L 45/16* (2013.01); *H01L 21/823475* (2013.01); *H01L 27/3225* (2013.01)

(58) Field of Classification Search
CPC . H01L 51/56; H01L 51/5092; H01L 51/5056; H01L 51/5072; H01L 51/5221
USPC ........................................................ 257/347
See application file for complete search history.

(56) References Cited

U.S. PATENT DOCUMENTS

| | | |
|---|---|---|
| 9,093,530 B2 | 7/2015 | Huang et al. |
| 9,105,490 B2 | 8/2015 | Wang et al. |

(Continued)

*Primary Examiner* — Andy Huynh
(74) *Attorney, Agent, or Firm* — McDermott Will & Emery LLP

(57) ABSTRACT

A method includes forming a transistor having source and drain regions. The following are formed on the source/drain region: a first via, a first metal layer extending along a first direction on the first via, a second via overlapping the first via on the first metal layer, and a second metal extending along a second direction different from the first direction on the second via; and the following are formed on the drain/source region: a third via, a third metal layer on the third via, a fourth via overlapping the third via over the third metal layer, and a controlled device at a same height level as the second metal layer on the third metal layer.

20 Claims, 24 Drawing Sheets

(51) Int. Cl.
*H01L 43/12* (2006.01)
*H01L 27/32* (2006.01)
*H01L 21/8234* (2006.01)

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 2009/0250680 A1* | 10/2009 | Takaura .............. H01L 27/2436 257/2 |
| 2011/0133293 A1* | 6/2011 | Shinkawata ...... H01L 27/10811 257/401 |
| 2012/0112314 A1* | 5/2012 | Jou .................... H01L 23/5223 257/532 |

* cited by examiner

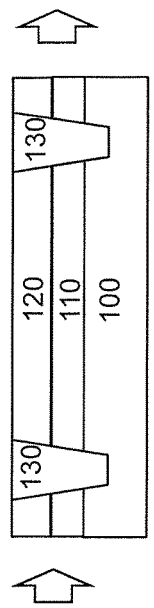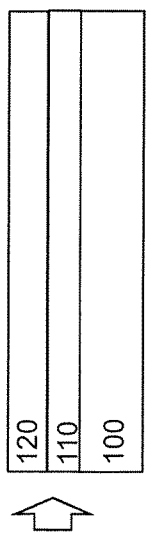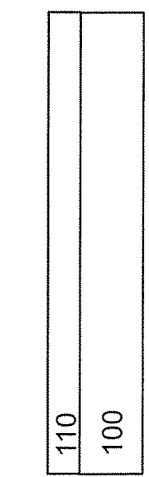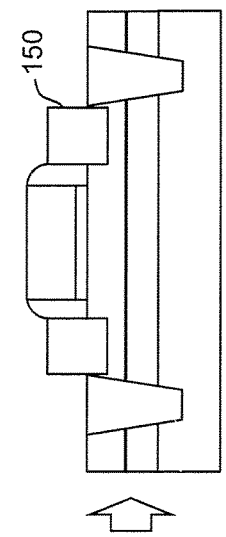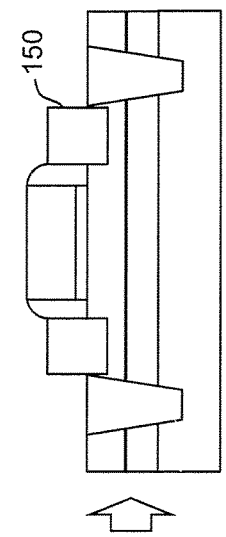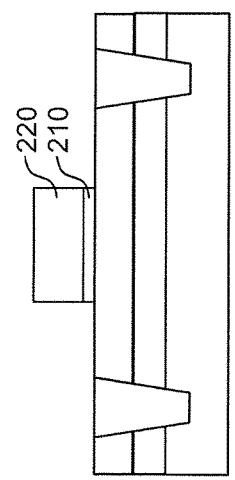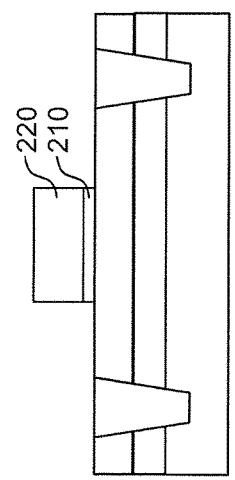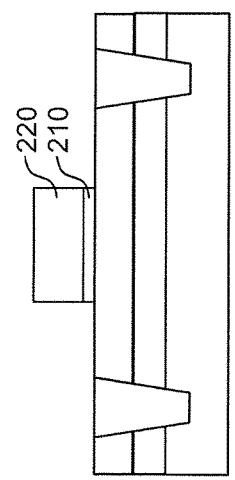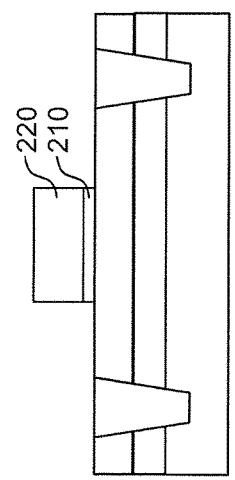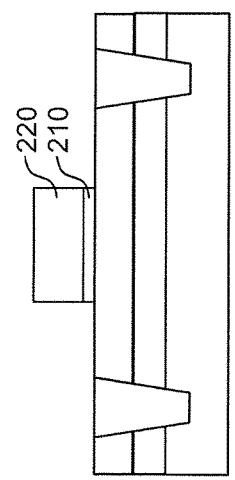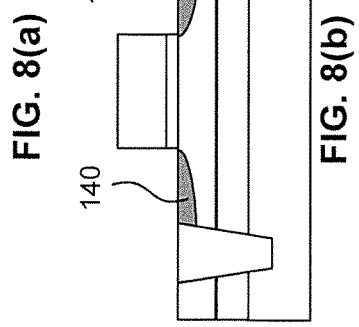

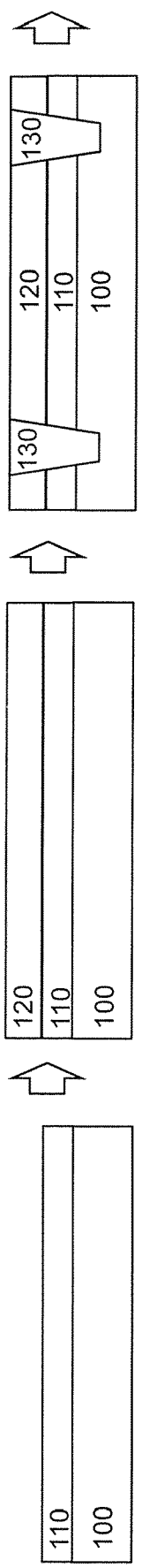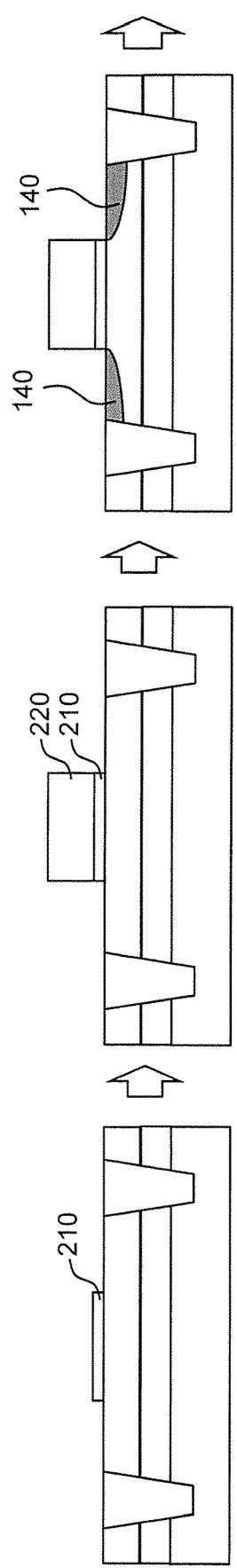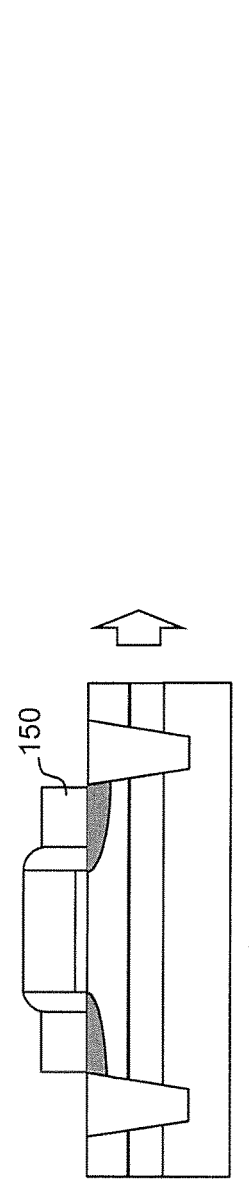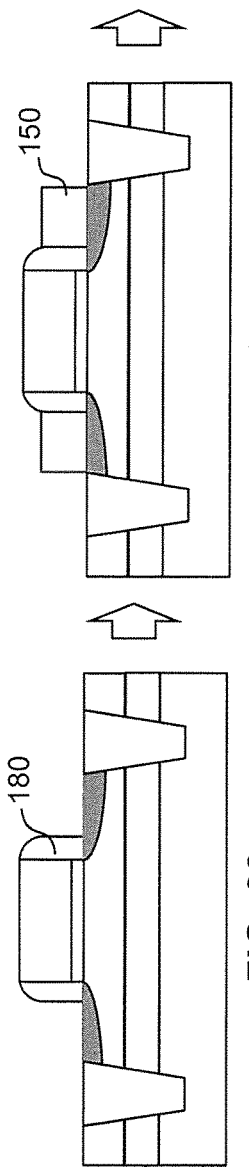
FIG. 22  FIG. 23  FIG. 24  FIG. 25  FIG. 26  FIG. 27  FIG. 28  FIG. 29

SEMICONDUCTOR DEVICE INCLUDING VERTICAL ROUTING STRUCTURE AND METHOD FOR MANUFACTURING THE SAME

RELATED CASE

The present application claims priority to and incorporates by reference the U.S. Provisional Application 62/586,726 filed on Nov. 15, 2017.

TECHNICAL FIELD

The disclosure relates to a semiconductor device and a method of manufacturing the same. More specifically, the disclosure relates to a semiconductor device having a vertical routing structure and designed by a strategy provided by the vertical routing structure of the device, and a method of manufacturing the same.

BACKGROUND

Along with the increased demand of high density integrated circuit for miniaturized devices such as portable devices or for more powerful computing capability, high aspect ratio devices are developed. Although the substrate surface area occupied by a high aspect ratio device is reduced compared to a low aspect ratio thin film device, the components of the control circuit for the high aspect ratio device still scatter over the surface of the substrate. For a device controlled by multiple controlling devices, for example, controlling multiple voltage levels of a source of a transistor so as to achieve a sophisticated control of a drain of the device, the multiple controlling devices would occupy a large surface area of the substrate. Thus, there is a demand for a versatile device that can enhance the controllability while efficiently reducing the substrate surface area occupied by the device and the controlling devices controlling the device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3, 4, 5, 6, 7, 8(a) or 8(b), 9(a) or 9(b), and 10(a) or 10(b) show sequential manufacturing operations of forming a portion of the semiconductor device in FIG. 1, according to embodiments of the present disclosure.

FIGS. 22, 23, 24, 25, 26, 27, 28, and 29 show sequential manufacturing operations of forming a portion of the semiconductor device in FIG. 21, according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Figure 1:
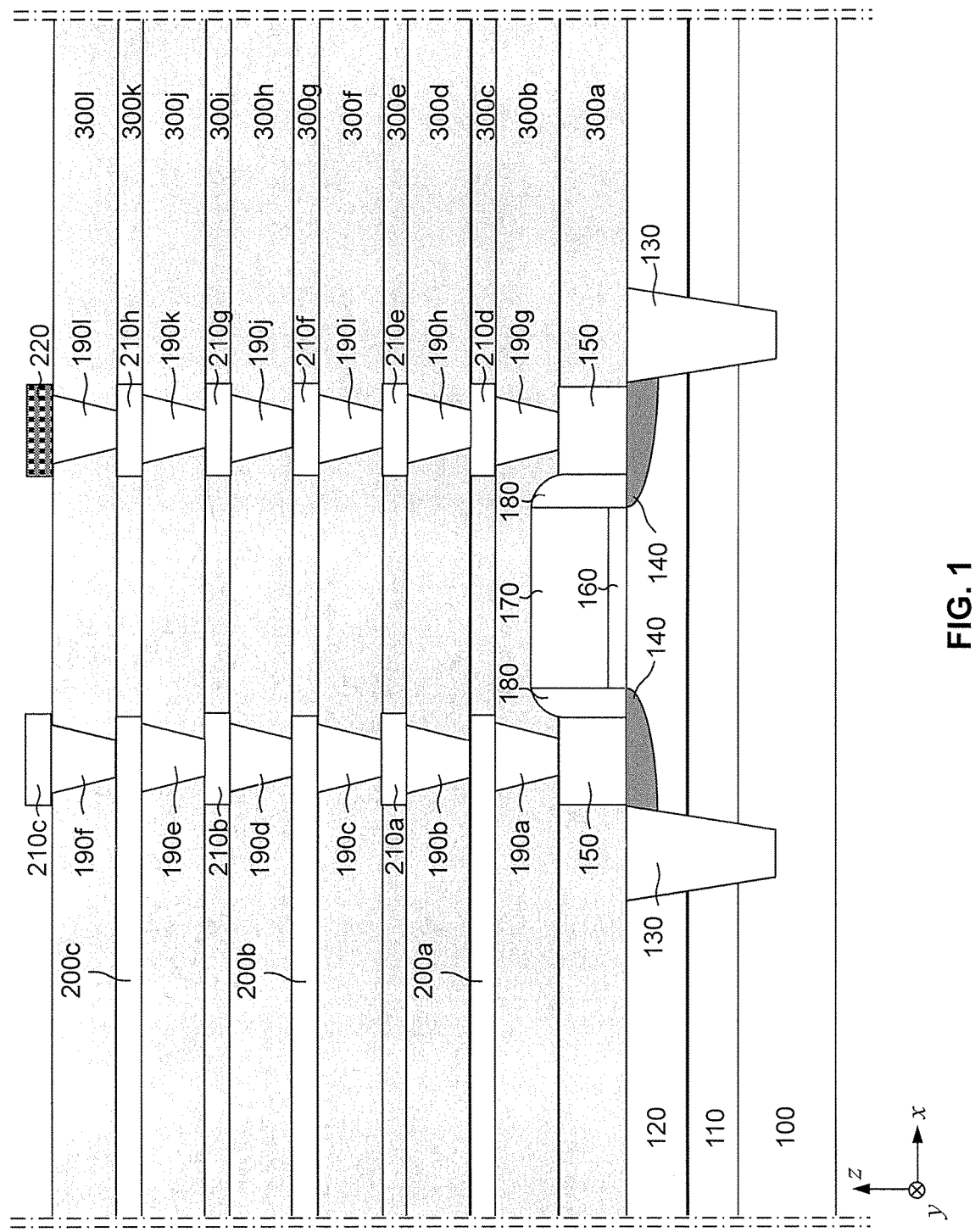
FIG. 1 shows a cross-sectional view of a semiconductor device cutting along the x direction or a source-to-drain direction, according to an embodiment of the present disclosure.

FIG. 1 shows a semiconductor device cutting along the x direction or a source-to-drain direction, according to an embodiment of the present disclosure. In some embodiments, the semiconductor device includes a transistor portion. In some embodiments, the transistor portion includes a planar transistor (FET). In some embodiments, the transistor portion includes a surrounding gate transistor or a FinFET. In the current technology node, a FinFET with a high-k dielectric and metal gate (HKMG) formed over a Si substrate is standard. Next generation FinFETs may be Ge FET, SiGe FET, a GAA (gate-all-around) FET. For a demonstration purpose, a planar transistor is shown in FIG. 1. The transistor portion is formed on a substrate 100. In some embodiments, the substrate 100 includes a single crystalline semiconductor layer on at least its surface portion. The substrate 100 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline silicon.

In FIG. 1, the semiconductor device includes a buffer layer 110. In some embodiments, the buffer layer 110 is a SiGe layer or an oxide layer such as silicon oxide, titanium oxide, molybdenum oxide, zinc oxide, indium oxide, tungsten oxide, magnesium oxide, calcium oxide, tin oxide, or the like. In some embodiments, the buffer layer 110 has a function of adjusting the stress and strain of a layer formed over it. In some embodiments, the buffer layer 110 prevents leakage current passed from a layer formed over it to other devices formed on the substrate 100. Generally, a SiGe buffer is used for SiGe FET or Ge FET. For Si FET, no buffer layer is used and the buffer layer 110 is removed from the Si FET in some embodiments.

In FIG. 1, the semiconductor device also includes a first well layer 120, a part of which is used for a channel for charge carrier transport in the transistor portion. In some embodiments, the first well layer 120 is appropriately doped. The first well layer 120 includes diffusion regions 140 as source/drain regions (hereinafter, for demonstration purpose, the left diffusion region 140 is assigned as a source region and the right diffusion region 140 is assigned as a drain region of the transistor portion. One of ordinary skill in the art understands that the left and right diffusion regions 140 can alternatively be drain and source regions, respectively, of the transistor). The diffusion regions 140 are formed by doping the first well layer 120 by an ion implantation method. The transistor portion further includes an isolation insulating layer 130 which is also called a shallow trench isolation (STI) layer. The isolation insulating layer 130 is made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, and combinations thereof.

In some embodiments, the transistor portion further includes second semiconductor layers 150 disposed on the source/drain regions 140, as a source/drain structure.

Between the source/drain regions 140, the transistor portion includes a gate stack which is formed of a gate dielectric layer 160 on the channel region of the first well layer 120 between the source/drain regions 140, and a gate electrode layer 170. In some embodiments, the gate electrode layer 170 is a single layer or multilayer structure. In some embodiments, the gate electrode layer 170 is poly-silicon. Further, the gate electrode layer 170 is doped poly-silicon with uniform or non-uniform doping, in some embodiments. In some alternative embodiments, the gate electrode layer 170 includes a metal, such as Al, Cu, W, Ti, Ta, TiN, TiAl, TlAlN, TaN, NiSi, CoSi, other conductive materials with a work function compatible with the substrate material, or combinations thereof. In the present embodiment, the gate electrode layer 170 has a thickness in a range of about 20 nm to about 100 nm.

In some embodiments, the gate dielectric layer 160 includes silicon oxide, silicon nitride, silicon oxy-nitride, or high-k dielectrics. The high-k dielectrics include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In the present embodiment, the gate dielectric layer 160 is a high-k dielectric layer with a thickness in the range of about 1 nm to about 5 nm. In some embodiments, the gate dielectric layer 160 further includes an interfacial layer (not shown) to reduce damage between the gate dielectric layer 160 and channel of the first well layer 120. The interfacial layer includes a chemically formed silicon oxide in some embodiments.

The gate stack is surrounded by sidewall spacers 180 which separate the gate stack from the source/drain regions 140. The sidewall spacers 180 include one or more of SiN, SiON, SiCN, SiCO, SiOCN or any other suitable dielectric material.

The transistor portion is covered by first interlayer dielectric (ILD) layers 300a, 300b, 300d, 300f, 300h, 300j, and 300l, in which through holes are formed, respectively, and vias 190a, 190b, 190c, 190d, 190e, 190f, 190g, 190h, 190i, 190j, 190k, and 190l are formed by filling the through holes with a conductive material. In some embodiments, the first ILD layers 300a and 300b are one layer instead of two layers. The two ILD layers 300a and 300b facilitate device formation on the ILD layers (e.g. the controlling device 400a is formed in the first ILD layer 300a while the via can be formed in the ILD layer 300b). In some embodiments, the vias are formed of an electrically conducting material including one or more of Co, Ni, W, Ti, Ta, Cu, Al, Mo, TiN, TaN, WSi$_2$, Ni—Si, Co—Si, WN, TiAlN, TaCN, TaC, TaSiN, metal alloys such as Ti—Al alloy, Al—Cu alloy, other suitable materials, and/or combinations thereof. In some embodiments, the conductive material is deposited using chemical vapor deposition (CVD), atomic layer deposition (ALD), electro-plating, or physical vapor deposition (PVD) followed by an optional reflow process, or other suitable film formation process.

The materials for the first ILD layers 300a, 300b, 300d, 300f, 300h, 300j, and 300l include inorganic compounds comprising Si, O, C and/or H, such as silicon oxide, SiCOH and SiOC, or organic materials, such as polymers.

The transistor portion is also covered by second interlayer dielectric (ILD) layers 300c, 300e, 300g, 300i, and 300k, in which trenches are formed by patterning the second ILD layers 300c, 300e, 300g, 300i, and 300k, respectively, and metal layers 200a, 200b, 200c, 210a, 210b, 210c, 210d, 210e, 210f, 210g, and 210h are formed by filling the trenches with a conductive material. In some embodiments, the metal layers 200a, 200b, 200c, 210a, 210b, 210c, 210d, 210e, 210f, 210g, and 210h are formed of an electrically conducting material including one or more of Co, Ni, W, Ti, Ta, Cu, Al, Mo, TiN, TaN, WSi$_2$, Ni—Si, Co—Si, WN, TiAlN, TaCN, TaC, TaSiN, metal alloys such as Ti—Al alloy, Al—Cu alloy, other suitable materials, and/or combinations thereof. In some embodiments, the conductive material is deposited using chemical vapor deposition (CVD), atomic layer deposition (ALD), electro-plating, or physical vapor deposition (PVD) followed by an optional reflow process, or other suitable film formation process. In some embodiments, the trenches for the metal layers 200a, 200b, 200c, 210a, 210b, 210c, 210d, 210e, 210f, 210g, and 210h are patterned in the second ILD layers 300c, 300e, 300g, 300i, and 300k before filling the through holes to form the vias 190a, 190b, 190c, 190d, 190e, 190f, 190g, 190h, 190i, 190j, 190k, and 190l, so that the metal layers 200a, 200b, 200c, 210a, 210b, 210c, 210d, 210e, 210f, 210g, and 210h and the vias 190a, 190*b*, 190*c*, 190*d*, 190*e*, 190*f*, 190*g*, 190*h*, 190*i*, 190*j*, 190*k*, and 190*l* are formed at the same time.

The materials for the second ILD layers 300*c*, 300*e*, 300*g*, 300*i*, and 300*k* include inorganic compounds comprising Si, O, C and/or H, such as silicon oxide, SiCOH and SiOC, or organic materials, such as polymers, in some embodiments. In some embodiments, the second ILD layers 300*c*, 300*e*, 300*g*, 300*i*, and 300*k* are formed of the same material as the first ILD layers 300*a*, 300*b*, 300*d*, 300*f*, 300*h*, 300*j*, and 300*l*. In some embodiments, the second ILD layers 300*c*, 300*e*, 300*g*, 300*i*, and 300*k* are formed of a material different from the first ILD layers 300*a*, 300*b*, 300*d*, 300*f*, 300*h*, 300*j*, and 300*l*.

In FIG. 1, a controlled device 220 is formed at a same height level as the metal layer 210*c*. In some embodiments, the controlled device 220 is a semiconductor component such as a light emitting diode, an organic light emitting diode, a memory, and a processor. In some embodiments, the controlled device 220 is a memory cell, such as a magnetic random access memory (MRAM) cell, a phase change random access memory (PCRAM) cell and/or a resistance change random access memory (RRAM) cell.

In FIG. 1, all the vias 190*a*, 190*b*, 190*c*, 190*d*, 190*e*, and 190*f* on the source region 140 overlap and align in the z direction with each other, forming a vertical routing structure together with pad structures formed by the metal layers 200*a*, 200*b*, 200*c*, 210*a*, 210*b*, and 210*c*. In some embodiments, all the vias 190*a*, 190*b*, 190*c*, 190*d*, 190*e*, and 190*f* on the source region 140 completely overlap each other (i.e. the greatest in-plane area in x-y plane of the vias overlapping each other without having any part in the in-plane area of any one of the vias not overlapped). In some embodiments, the geometric centers of the vias and pads are located within a hypothetical circle C (FIG. 2(*a*)) having a diameter less than about 1.0 nm in the x-y plane. In other embodiments, the diameter of the circle C is less than about 0.5 nm. In some embodiments, the sizes or areas of the overlapping vias, e.g. 190*a* and 190*b*, are not the same.

In FIG. 1, the number of vias is six (6), but the number of vias is not limited to 6. The number of vias in the vertical routing structure can be two, three, four or five, or more than six, and up to twenty.

In FIG. 1, a controlled device 220 is formed at a same height level as the metal layer 210*c*. In some embodiments, the controlled device 220 performs by receiving different voltages applied by the drain region 140 of the transistor portion. The different voltages supplied from the drain region 140 are due to the different voltages applied to the source region 140 by different controlling devices connected to the metal layers 200*a*, 200*b*, 200*c*, 210*a*, 210*b*, and/or 210*c*.

Figure 2A:
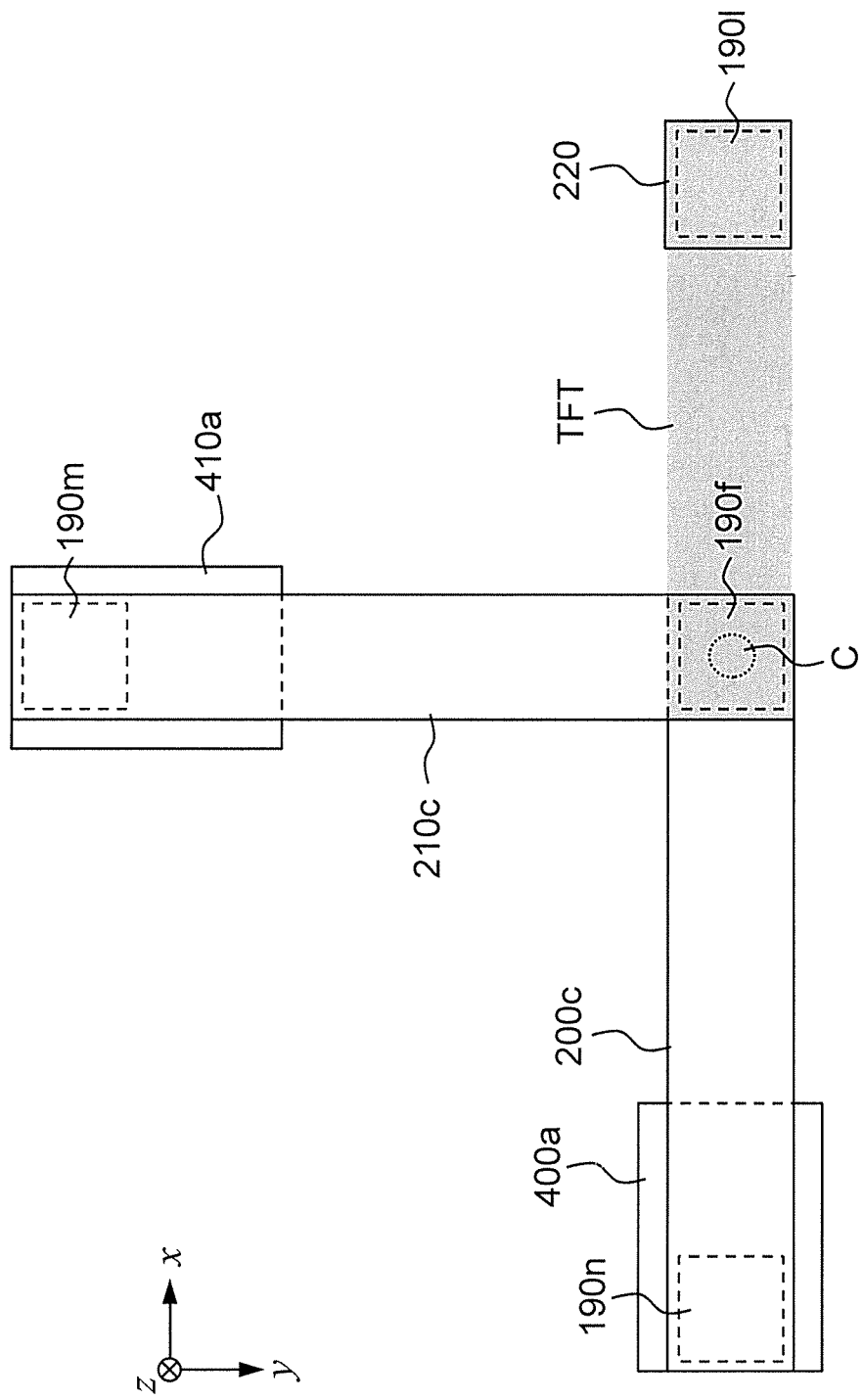
FIG. 2(a) shows a top plan view of the semiconductor device in FIG. 1, and FIGS. 2(b) and 2(c) show alternative embodiments of FIG. 2(a).
Figure 2B:
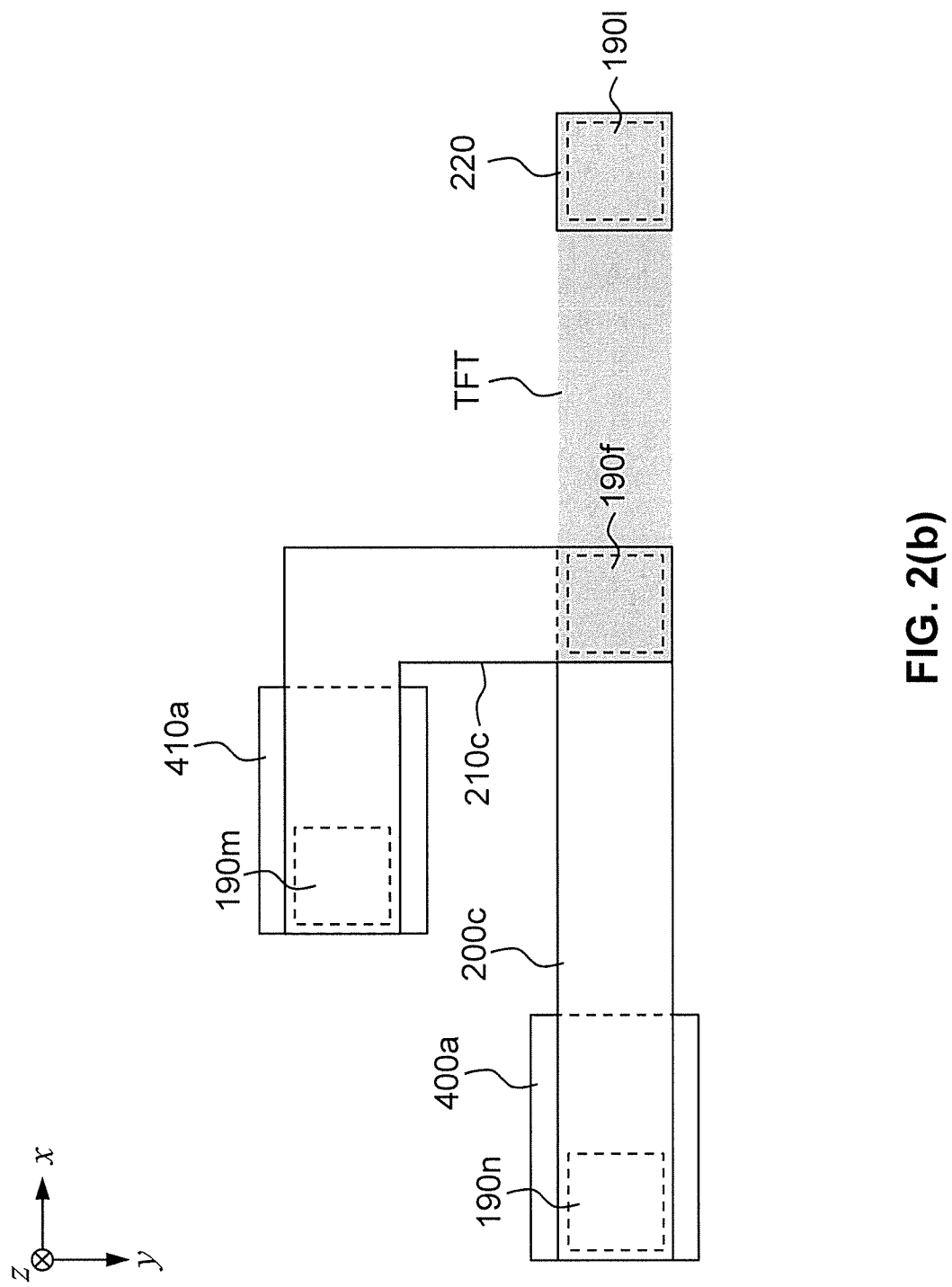

FIG. 2(*a*) shows a top plan view of the semiconductor device in FIG. 1. The metal layer 200*c* and the metal layer 210*c* are formed to extend in different directions in some embodiments. That is, in the embodiment shown in FIG. 2(*a*), the metal layer 200*c* extends in the −x direction, and the metal layer 210*c* extends in the −y direction.

In FIG. 2(*a*), the metal layer 200*c* has one end portion contacting a via 190*f* which overlaps a source region 140 of the transistor portion. The metal layer 200*c* has an opposite end portion contacting a via 190*n* which is connected to another metal layer or is electrically connected to a device 400*a*, such as a capacitor, a resistor, a transistor, a processor, a logic circuit, a driver circuit and combinations thereof (FIG. 2(*a*)). The device 400*a* includes a controlling device that controls a voltage applied to the source region 140, and in this way, the operation of the controlled device 220 can be controlled by the controlling device connected to the via 190*n* contacting the metal layer 200*c*, in some embodiments.

In FIG. 2(*a*), the metal layer 210*c* has one end portion contacting a via 190*f* which overlaps a source region 140 of the transistor portion. The metal layer 210*c* has an opposite end portion contacting a via 190*m* which is connected to another metal layer or electrically connected to a device, such as a capacitor, a transistor, a processor, a logic circuit, a driver circuit and combinations thereof, in some embodiments. The device includes a controlling device that controls a voltage applied to the source region 140, and in this way, the operation of the controlled device 220 of the semiconductor device can be controlled by the controlling device connected to the via 190*m* contacting the metal layer 210*c*, in some embodiments. Thus, the controlled device 220 can be controlled by the controlling devices connected to the vias 190*n* and/or 190*m*. In some embodiments, the controlling devices (not shown in FIG. 2(*a*)) directly contact the metal layers e.g. 190*n* and 190*m*, and not through any vias.

The operation of the controlled device 220 is dependent upon a combination of voltages (signals) applied by the controlling devices (not shown in FIG. 2(*a*)) to the source region 140 of the transistor portion through the metal layers 190*n* and 190*m*, in some embodiments. The higher the number of the controlling devices, the higher the number of combinations of signals applied to the source region 140, the higher the number of possible ways the operation of the controlled device 220 can be performed and the more versatile the controlled device 220.

FIG. 2(*b*) shows a top plan view of an alternative embodiment of FIG. 2(*a*). In FIG. 2(*b*), the metal layer 200*c* and the metal layer 210*c* are formed to extend in different directions in some embodiments. That is, in the embodiment shown in FIG. 2(*b*), the metal layer 200*c* extends in the −x direction, and the metal layer 210*c* extends in the −y direction and then in the −x direction. That is, the metal layer 210*c* is a bent metal layer and not a straight metal layer. The metal layer 210*c* is formed to fulfill a specific circuit design of the semiconductor device, for example, for small controlling devices connected to the metal layers 190*n* and/or 190*m*.

In FIG. 2(*b*), the metal layer 200*c* has one end portion contacting a via 190*f* which overlaps a source region 140 of the transistor portion. The metal layer 200*c* has an opposite end portion contacting a via 190*n* which is connected to another metal layer or is electrically connected to a device 400*a*, such as a capacitor, a resistor, a transistor, a processor, a logic circuit, a driver circuit and combinations thereof. The device 400*a* includes a controlling device that controls a voltage applied to the source region 140, and in this way, the operation of the controlled device 220 can be controlled by the controlling device connected to the via 190*n* contacting the metal layer 200*c*, in some embodiments. In some embodiments, the controlling device 400*a* directly contacts the metal layer 200*c* and not through any via.

In FIG. 2(*b*), the metal layer 210*c* has one end portion contacting a via 190*f* which overlaps a source region 140 of the transistor portion. The metal layer 210*c* has an opposite end portion contacting a via 190*m* which is connected to another metal layer or electrically connected to a device 410*a*, such as a capacitor, a transistor, a processor, a logic circuit, a driver circuit and combinations thereof, in some embodiments. The device 410*a* includes a controlling device that controls a voltage applied to the source region 140, and in this way, the operation of the controlled device 220 can be controlled by the controlling device connected to the via 190*m* contacting the metal layer 210*c*, in some embodiments. In some embodiments, the controlling device 410a directly contacts the metal layer 210c and not through any via.

The operation of the controlled device 220 is dependent upon a combination of voltages (signals) applied by the controlling devices e.g. 400a and 410a to the source region 140 of the transistor portion through the metal layers 190n and 190m respectively, in some embodiments. The higher the number of the controlling devices, the higher the number of combinations of signals applied to the source region 140, the higher the number of possible ways the operation of the controlled device 220 can be performed, and the more versatile the controlled device 220.

Figure 2C:
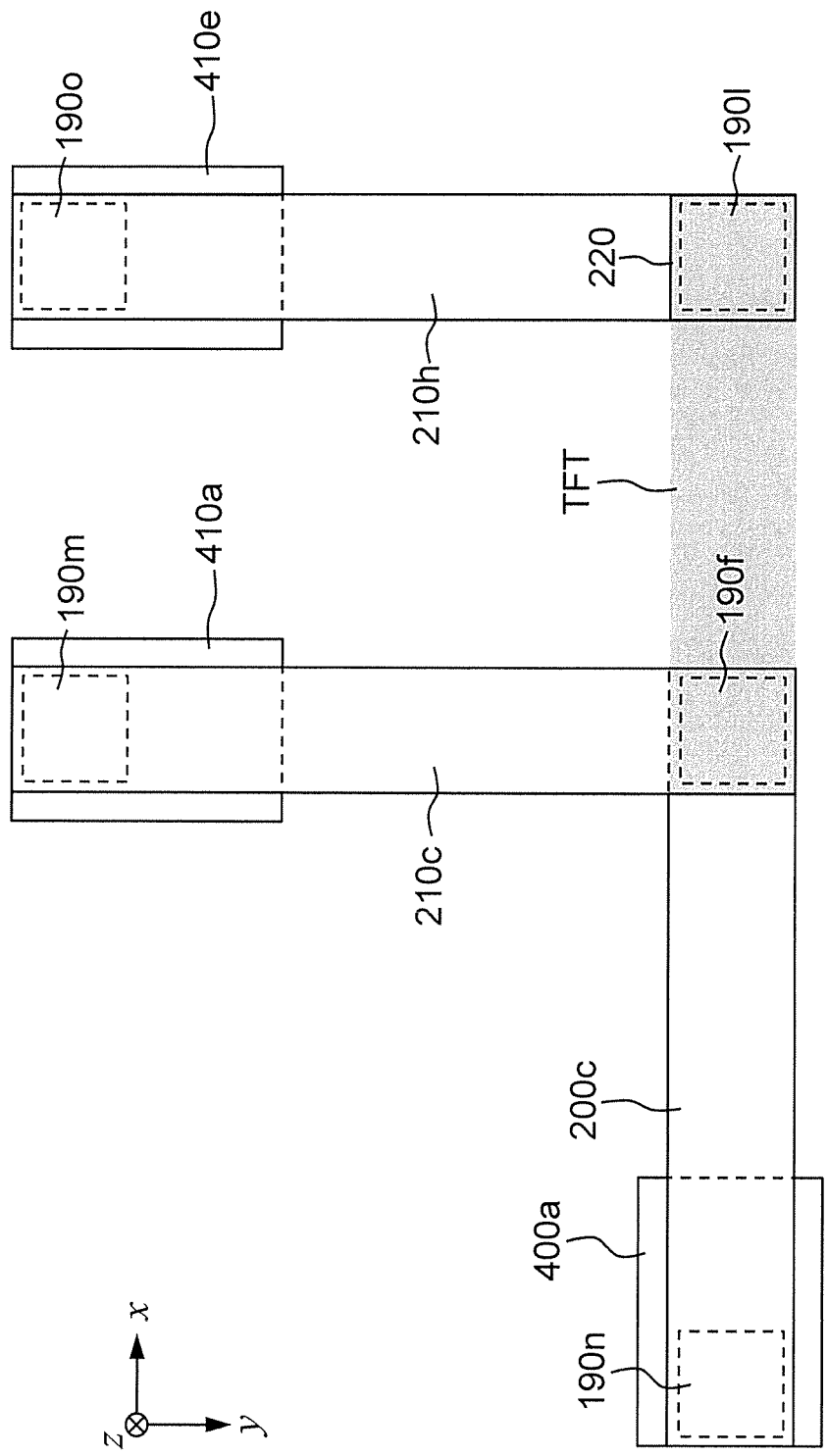

FIG. 2(c) shows a top plan view of an alternative embodiment of FIG. 2(a). In FIG. 2(c), metal layer 210h and metal layer 210c extend in the same direction. In some embodiments, the metal layer 210h and the metal layer 210c extend in different directions such as perpendicular directions, i.e., the x and −y directions. The metal layer 210h contacts a via 190o and a controlling device (not shown in FIG. 2(c)) connects to the via 190o to control the controlled device 220 at the drain side. That is, the voltage generated by the drain region is altered by the voltage applied by the controlling device through the via 190o and the metal layer 210h to achieve a desired performance of the controlled device 220.

In FIG. 2(c), the metal layer 200c has one end portion contacting a via 190f which overlaps a source region 140 of the transistor portion. The metal layer 200c has an opposite end portion contacting a via 190n which is connected to another metal layer or is electrically connected to a device 400a, such as a capacitor, a resistor, a transistor, a processor, a logic circuit, a driver circuit and combinations thereof (FIG. 2(c)). The device 400a includes a controlling device that controls a voltage applied to the source region 140, and in this way, the operation of the controlled device 220 can be controlled by the controlling device connected to the via 190n contacting the metal layer 200c, in some embodiments.

In FIG. 2(c), the metal layer 210c has one end portion contacting a via 190f which overlaps a source region 140 of the transistor portion. The metal layer 210c has an opposite end portion contacting a via 190m which is connected to another metal layer or electrically connected to a device 410a, such as a capacitor, a transistor, a processor, a logic circuit, a driver circuit and combinations thereof, in some embodiments. The device 410a includes a controlling device that controls a voltage applied to the source region 140, and in this way, the operation of the controlled device 220 can be controlled by the controlling device connected to the via 190m contacting the metal layer 210c, in some embodiments. In some embodiments, the controlling device 410a directly contacts the metal layer 210c and not through any via.

The embodiment in FIG. 2(c) further includes a metal layer 210h. The metal layer 210h has one end portion contacting a via 190l which overlaps a drain region 140 of the transistor portion. The metal layer 210h has an opposite end portion contacting a via 190o which is connected to another metal layer or electrically connected to a device 410e, such as a capacitor, a transistor, a processor, a logic circuit, a driver circuit and combinations thereof, in some embodiments. The device 410e includes a controlling device that controls a voltage applied to the drain region 140, and in this way, the operation of the controlled device 220 can be controlled by the controlling device connected to the via 190o contacting the metal layer 210h, in some embodiments. In some embodiments, the controlling device 410e directly contacts the metal layer 210h and not through any via.

The operation of the controlled device 220 is dependent upon a combination of voltages (signals) applied by the controlling devices e.g. 400a, 410a, and 410e to the source region 140 of the transistor portion through the metal layers 190n and 190m respectively, in some embodiments. The higher the number of the controlling devices, the higher the number of combinations of signals applied to the source region 140, the higher the number of possible ways the operation of the controlled device 220 can be performed and the more versatile the controlled device 220.

In some embodiments, the vias 190f, 190m, 190n, 190l, and 190o have a rectangular in-plane cross-sectional shape. In some embodiments, the vias 190f, 190m, 190n, 190l, and 190o have an in-plane cross-sectional shape of a circle, an oval, a triangle, a square, a square with rounded corners, a pentagon, a hexagon, or the like. In some embodiments, the overlapping vias such as the vias in the source region side, have the same in-plane cross-sectional shape while the overlapping vias such as the vias in the drain region side have the same in-plane cross-sectional shape. In some embodiments, the vias in the source region side have an in-plane cross-sectional shape different from the vias in the drain region side. In some embodiments, the vias in the source region side have an in-plane cross-sectional shape the same as the vias in the drain region side.

FIG. 3, 4, 5, 6, 7, 8(a) or 8(b), 9(a) or 9(b), and 10(a) or 10(b) show sequential manufacturing operations of forming a portion of the semiconductor device in FIG. 1, according to embodiments of the present disclosure. It is understood that in the sequential manufacturing process, one or more additional operations can be provided before, during, and after the stages shown in FIGS. 3-10, and some of the operations described below can be replaced or eliminated for additional embodiments of the method. The order of the operations/processes may be interchangeable. In FIG. 3, a buffer layer 110 is formed on a substrate 100 by a deposition method, such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process such as wet thermal oxidation method. In some embodiments, the buffer layer 110 is a SiGe layer.

In FIG. 4, a first well layer 120 is formed over the substrate 100 by a deposition method, such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process. The first well layer 120 is formed to a thickness to reduce stress/strain in some embodiments. For example, but not limited to, the first well layer 120 is formed to have a thickness of about 2 nm to about 20 nm in some embodiments. The first well layer 120 includes a germanium layer or a silicon layer, in some embodiments. Also, the first well layer 120 is doped by an n-type dopant to increase the charge carrier concentrations, and the n-type dopant includes phosphorus, in certain embodiments. The doping operation can be carried out by in-situ doping during deposition of the first well layer 120 and/or ion implantation. In this way, the first well layer 120 can be a phosphorus doped germanium layer or a phosphorus doped silicon layer. In some embodiments, the buffer layer 110 is not formed, and the substrate 100 is partially doped with appropriate dopant, thereby forming a well layer 120.

In FIG. 5, shallow trench isolation (STI) layers, which are also called isolation insulating layers 130, are formed through an etching process, a film forming process, such as CVD, flowable CVD (FCVD), or a spin-on-glass process, and a planarization process, such as chemical mechanical polishing, although any acceptable process may be utilized. In other embodiments, the STI layers 130 are formed before the well layers 120 and/or buffer layer 110 are formed, and the well layers 120 and/or the buffer layer 110 are formed over the surface of the semiconductor substrate 100 where no STI layer is formed.

In FIGS. 6 and 7, a gate stack is formed on the first well layer 120, and the gate stack includes gate dielectric layer 210 and gate electrode layer 220. The gate dielectric layer 210 is formed using a suitable process such as physical vapor deposition (PVD), chemical vapor deposition (CVD), atomic layer deposition (ALD), thermal oxidation, UV-ozone oxidation, or combinations thereof. The gate electrode layer 220 can be formed by using CVD, including LPCVD and PECVD, PVD, ALD, or other suitable process. The formed gate electrode layer 220 and the gate dielectric layer 210 are patterned by photolithographic and etching methods. In some embodiments, a gate replacement technology is used.

FIG. 8(b) shows an operation to form diffusion regions at source and drain regions 140 in the first well layer 120. The diffusion regions are formed by doping the first well layer 120 by ion implantation using the gate electrode layer 220 as a mask. The dopant concentration is in a range from about $5 \times 10^{17}$ to about $5 \times 10^{18}$ cm$^{-3}$ in some embodiments.

FIG. 9(b) shows an operation of forming the sidewall spacer 180 surrounding the gate stack. The sidewall spacer 180 can be formed by ALD or CVD, or any other suitable method and anisotropic etching.

In FIG. 10(b), in some embodiments, the second semiconductor layer 150 is epitaxially grown on the source and drain regions 140 in the first well layer 120 by a method including LPCVD and PECVD, PVD, ALD, or other suitable process, such as epitaxy methods including vapor-phase epitaxy (VPE), chemical vapor deposition, molecular-beam epitaxy (MBE), liquid-phase epitaxy (LPE). The second semiconductor layer 150 is formed to a thickness to apply stress/strain in the structure. For example, but not limited to, the second semiconductor layer 150 is formed to have a thickness of about 2 nm to about 20 nm in some embodiments. The second semiconductor layer 150 includes a SiGe, SiP, SiC, and/or SiCP layer, in some embodiments. Also, the second semiconductor layer 150 is doped by an n-type dopant to increase the charge carrier concentrations, and the n-type dopant includes phosphorus, in certain embodiments. The doping operation can be carried out by in-situ deposition or ion implantation. In this way, the second semiconductor layer 150 can be a phosphorus doped silicon layer. The P doped Si layer can reduce contact resistance at the interface between a metal layer such as via 190a (FIG. 1) and the second semiconductor layer 150.

In some embodiments, instead of forming the source and drain regions 140 by ion implantation (FIG. 8(b)) and forming the second semiconductor layer 150 thereon (FIG. 10(b)), as shown in FIGS. 8(b), 9(b), and 10(b), regions of the first well layer 120 (FIG. 8(a)) to be source and drain regions are recessed by one or more lithography and etching operations, forming the recesses 140' in FIG. 9(a), and the second semiconductor layer 150 is epitaxially formed in and over the recesses 140' in FIG. 10(a). In some embodiments, the recesses 140' are formed after the sidewall spacer 180 is formed (FIG. 9(a)). In some embodiment, the second semiconductor layer 150 is selectively formed in and over the recess 140'.

Figure 11:
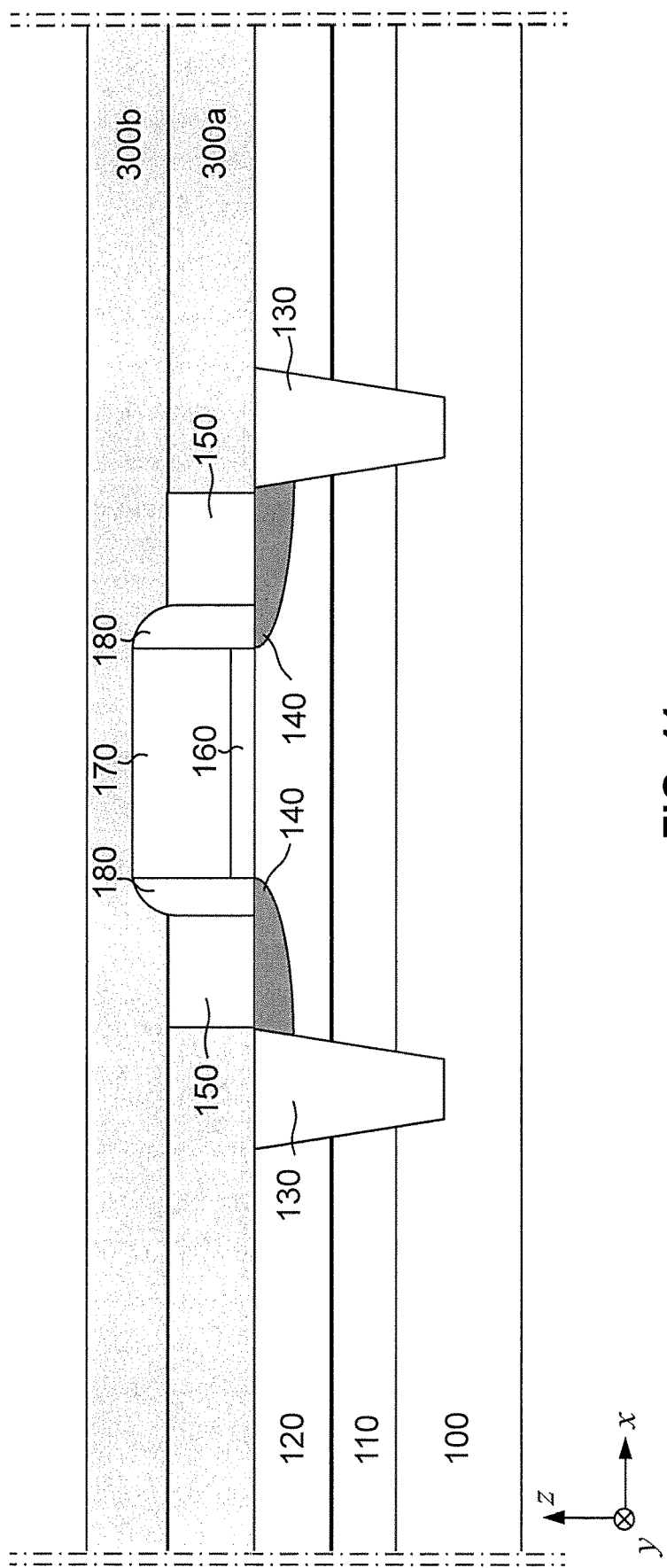
FIGS. 11, 12, 13, 14, 15, 16, and 17 show sequential manufacturing operations of forming the remaining portion of the semiconductor device in FIG. 1, according to embodiments of the present disclosure.

FIG. 11 shows an operation of forming a dielectric structure on the transistor portion and the substrate 100. The operation of forming the dielectric structure is performed using a deposition technique, such as a chemical vapor deposition (CVD) technique or a physical vapor deposition (PVD) technique. In some embodiments, the operation of forming the dielectric structure includes forming ILD layers 300a and 300b stacked on each other. In some embodiments, the ILD layers 300a and 300b are formed from silicon oxide, SiOC, SiON and/or SiOCN. In some embodiments, the ILD layers 300a and 300b are formed of the same material deposited continuously. In some embodiments, the ILD layers 300a and 300b are formed of different materials. Depending on the materials used to form the ILD layers 300a and 300b, etching rates of the ILD layers 300a and 300b are the same for the ILD layers 300a and 300b formed of the same material, and etching rates of the ILD layers 300a and 300b are different for the ILD layers 300a and 300b formed of the different materials. For different etching rates, the ILD layer 300a can act as an etch stop layer while the ILD layer 300b is etched to form structures such as through holes on the ILD layer 300a for vias. In this situation, the ILD layer 300a completely covers the transistor portion (not shown). 150

Figure 12:
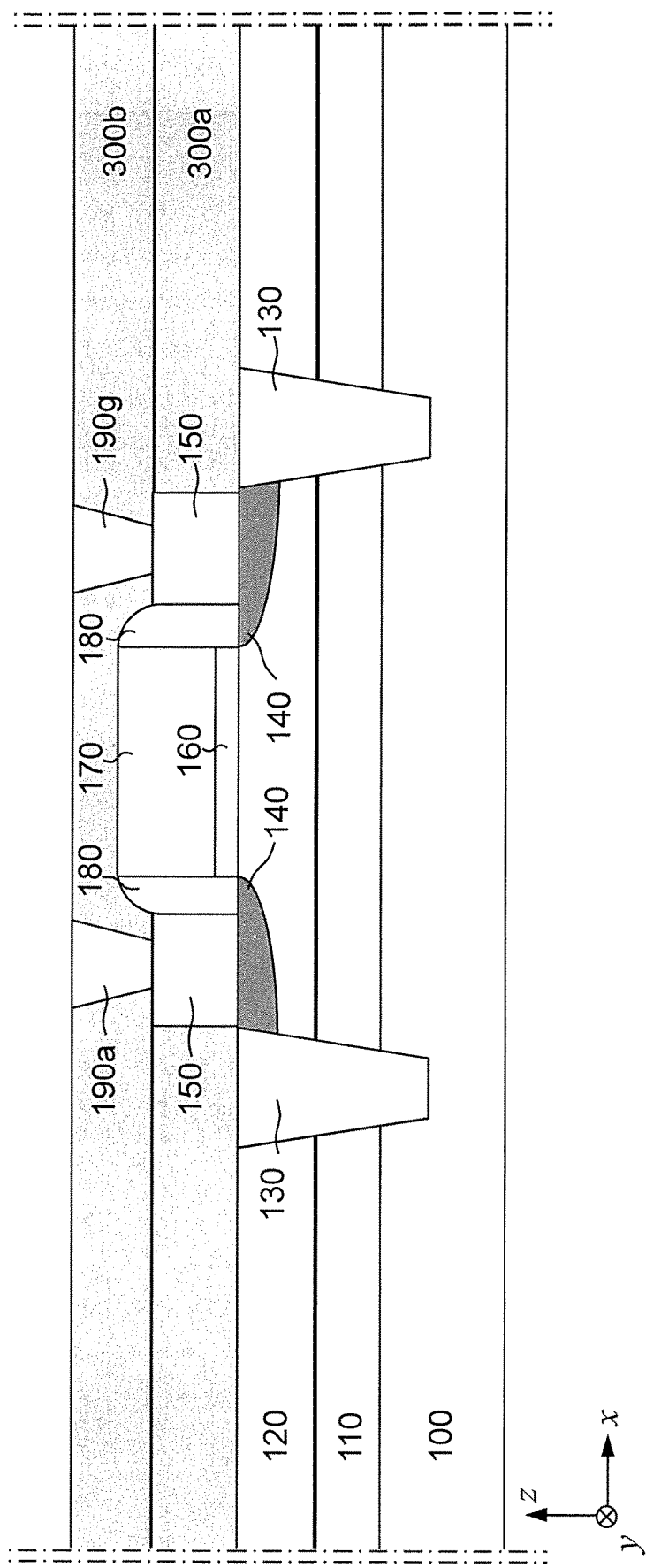

FIG. 12 shows an operation of forming through holes in the ILD layer 300b. In some embodiments, the operation of forming the through holes includes removing a portion of the ILD layer 300b using an etching technique, such as a dry etching technique, a photolithographic and etching method, directional etching method, and cyclotron resonance plasma etching. Vias 190a and 190g are formed by filling the through holes using a method such as chemical vapor deposition (CVD), including low pressure CVD (LPCVD) and plasma enhanced CVD (PECVD), atomic layer deposition (ALD), non-conformal physical vapor deposition (PVD) such as pulsed laser deposition (PLD), sputtering, evaporative deposition, cathodic arc deposition, e-beam physical vapor deposition, or other suitable process. In some embodiments, the vias 190a and 190g are through vias that completely penetrate the ILD layer 300b. In some embodiments, each of the vias 190a and 190g has a vertical portion penetrating the ILD layer 300b and another vertical portion not penetrating the ILD layer 300b, and in this way, the via 190a or 190g partially penetrates the ILD layer 300b. This structure of the via 190a or 190g functions to adjust the resistance along the vertical axis of the via 190a or 190g so as to fulfill a specific device design for carrying out specific functions of the device for various purposes. In some embodiments, this partially penetrating via structure functions to balance the resistances of the vias 190a and 190g to achieve the same resistance value of the device. In some embodiments, this partially penetrating via structure has different resistances at the source portion 140 and the drain portion 140 to achieve a specific transistor portion for specific purposes.

Figure 13:
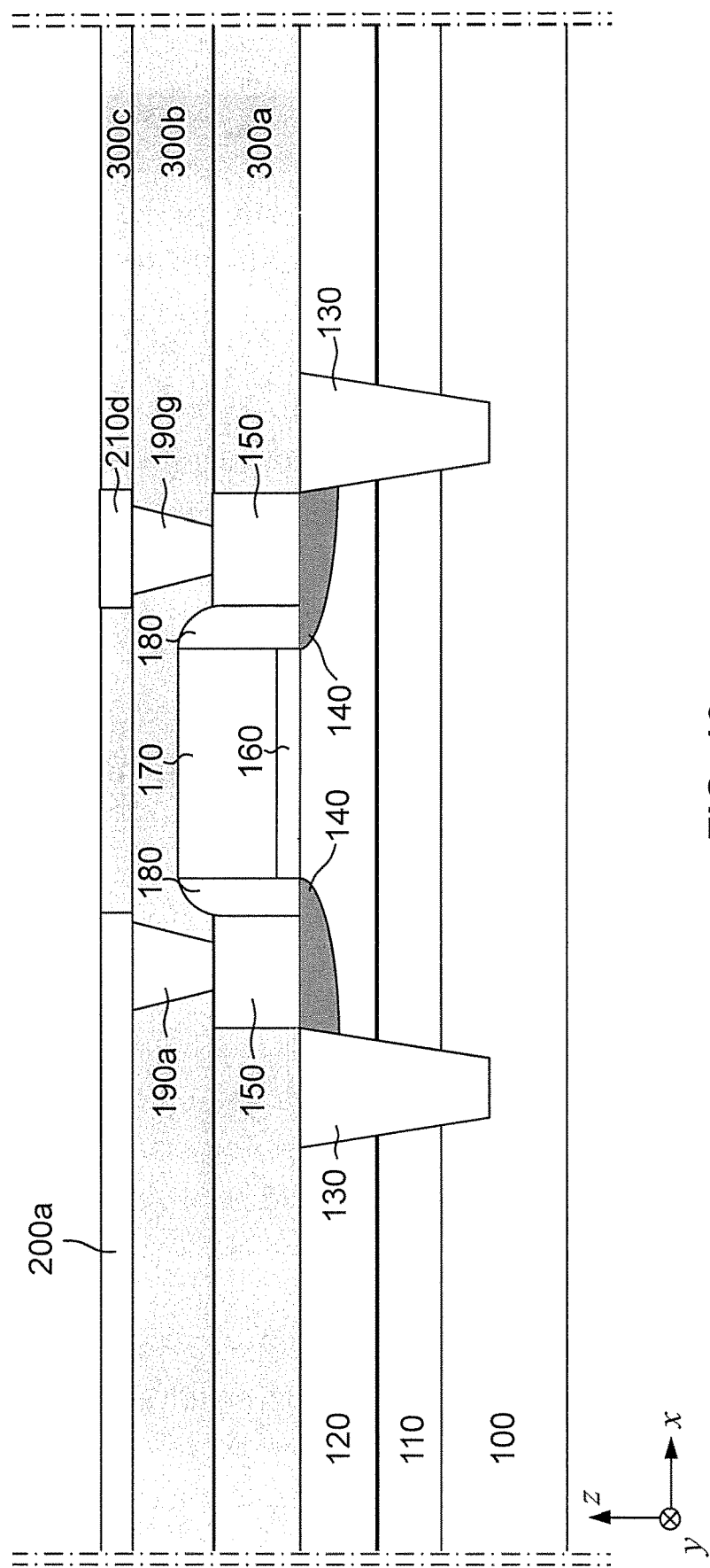

FIG. 13 shows an operation of forming the ILD layer 300c and metal layers 200a and 210d in the ILD layer 300c. In some embodiments, the operation of forming the ILD layer 300c is performed using a deposition technique, such as a chemical vapor deposition (CVD) technique or a physical vapor deposition (PVD) technique. In some embodiments, the ILD layer 300c is formed from silicon nitride, silicon carbide or silicon oxide. In some embodiments, the ILD layer 300c is formed of the same material as the ILD layer 300b. In some embodiments, the ILD layer 300c is formed of a material different from the ILD layer 300b. Depending on the materials used to form the ILD layers 300c and 300b, etching rates of the ILD layers 300c and 300b are the same for the ILD layers 300c and 300b formed of the same material, and etching rates of the ILD layers 300c and 300b are different for the ILD layers 300c and 300b formed of the different materials.

The formed ILD layer 300c is patterned to form trenches to be filled by a metal to form metal layers 200a and 210d. In some embodiments, the patterning technique is a photolithographic and etching method such as DUV photolithography using a mask and plasma etching, or a cyclotron plasma etching method. Metal layers 200a and 210d are formed by filling the trenches using a method such as chemical vapor deposition (CVD), including low pressure CVD (LPCVD) and plasma enhanced CVD (PECVD), atomic layer deposition (ALD), non-conformal physical vapor deposition (PVD) such as pulsed laser deposition (PLD), sputtering, evaporative deposition, cathodic arc deposition, e-beam physical vapor deposition, or other suitable process. In some embodiments, the metal layers 200a and 210d are formed of a material from among the above described materials used to form the vias 190a and 190g. In some embodiments, the metal layers 200a and 210d are formed of the same material as the vias 190a and 190g. In some embodiments, the metal layers 200a and 210d are formed of a material different from the vias 190a and 190g. In some embodiments, the metal layers 200a and 210d and the vias are formed in the same process in the same processing chamber. In some embodiments, the metal layers 200a and 210d and the vias 190a and 190g are formed in separate processes which are carried out in the same chamber or in different chambers through a wafer translation mechanism. In some embodiments, a dual damascene method is applied.

Figure 14:
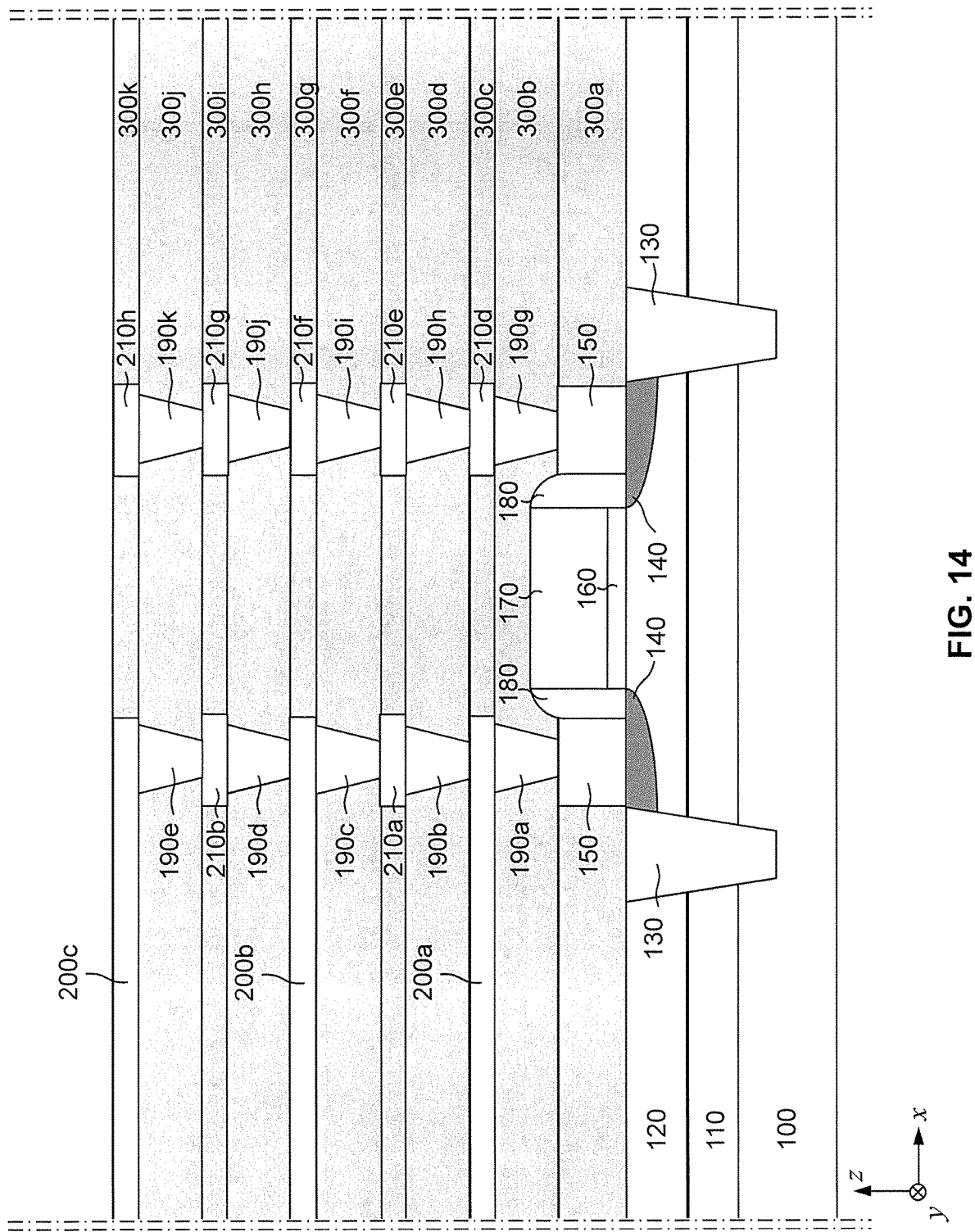
Figure 15:
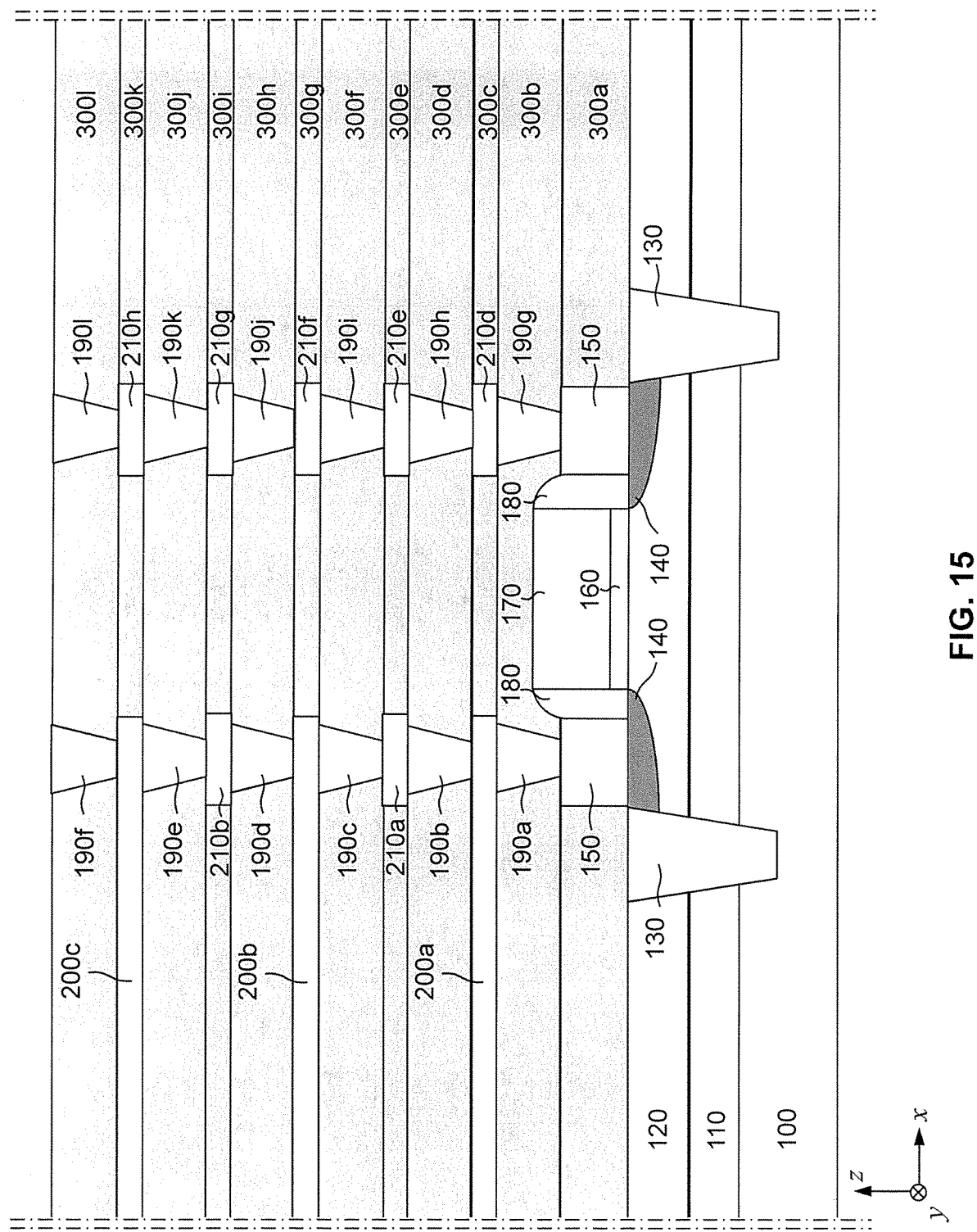
Figure 16:
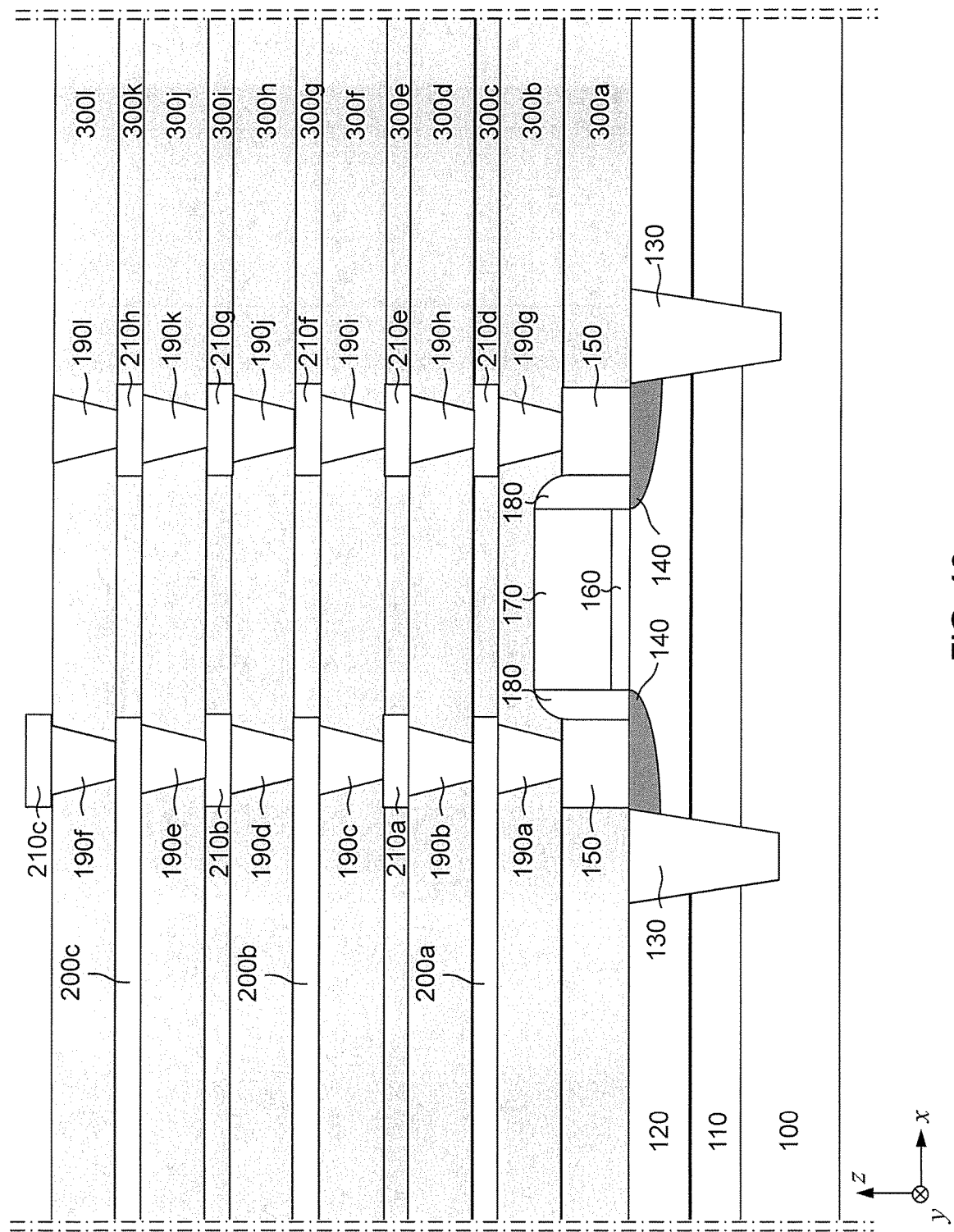

In FIGS. 14, 15, and 16, the formation of the ILD layers 300d, 300e, 300f, 300g, 300h, 300i, 300j, 300k, and 300l, the formation of vias 190b, 190c, 190d, 190e, 190f, 190h, 190i, 190j, 190k, 190l, and the formation of metal layers 200b, 200c, 210a, 210b, 210c, 210e, 210f, 210g, and 210h use the above described operations in FIGS. 11, 12, and 13. In some embodiments, the operations in FIGS. 14, 15, and 16 are carried out in any combination of methods and materials, including same method, different methods, same method for some layers and different methods for some layers, same material and different materials.

Figure 17:
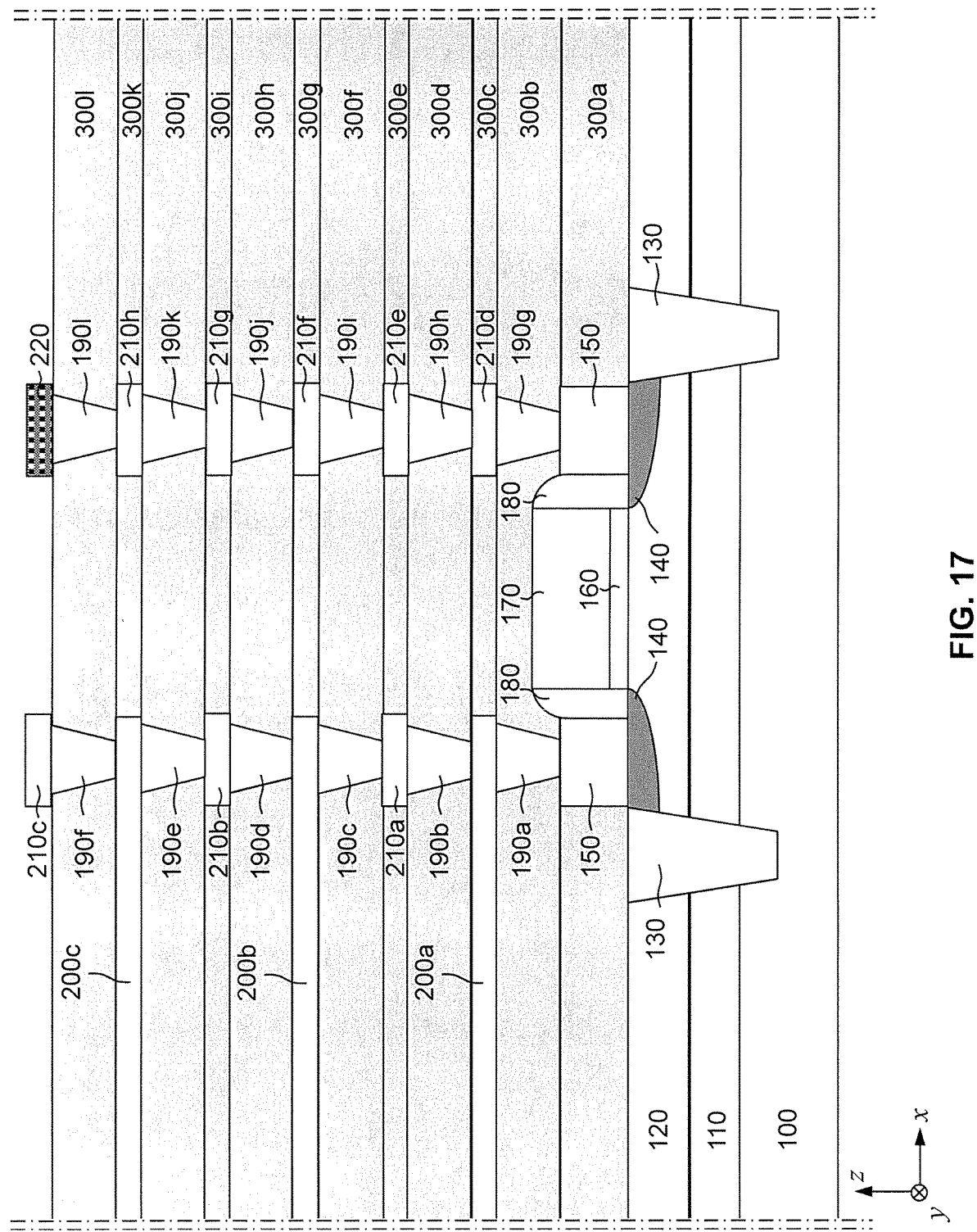

In FIG. 17, a controlled device 220 is formed at a same height level as the metal layer 210c. In some embodiments, the controlled device 220 is a semiconductor component such as a light emitting diode, an organic light emitting diode, a memory, and a processor. In some embodiments, the controlled device 220 performs by receiving different voltages applied by the drain region 140 of the transistor portion.

Figure 18:
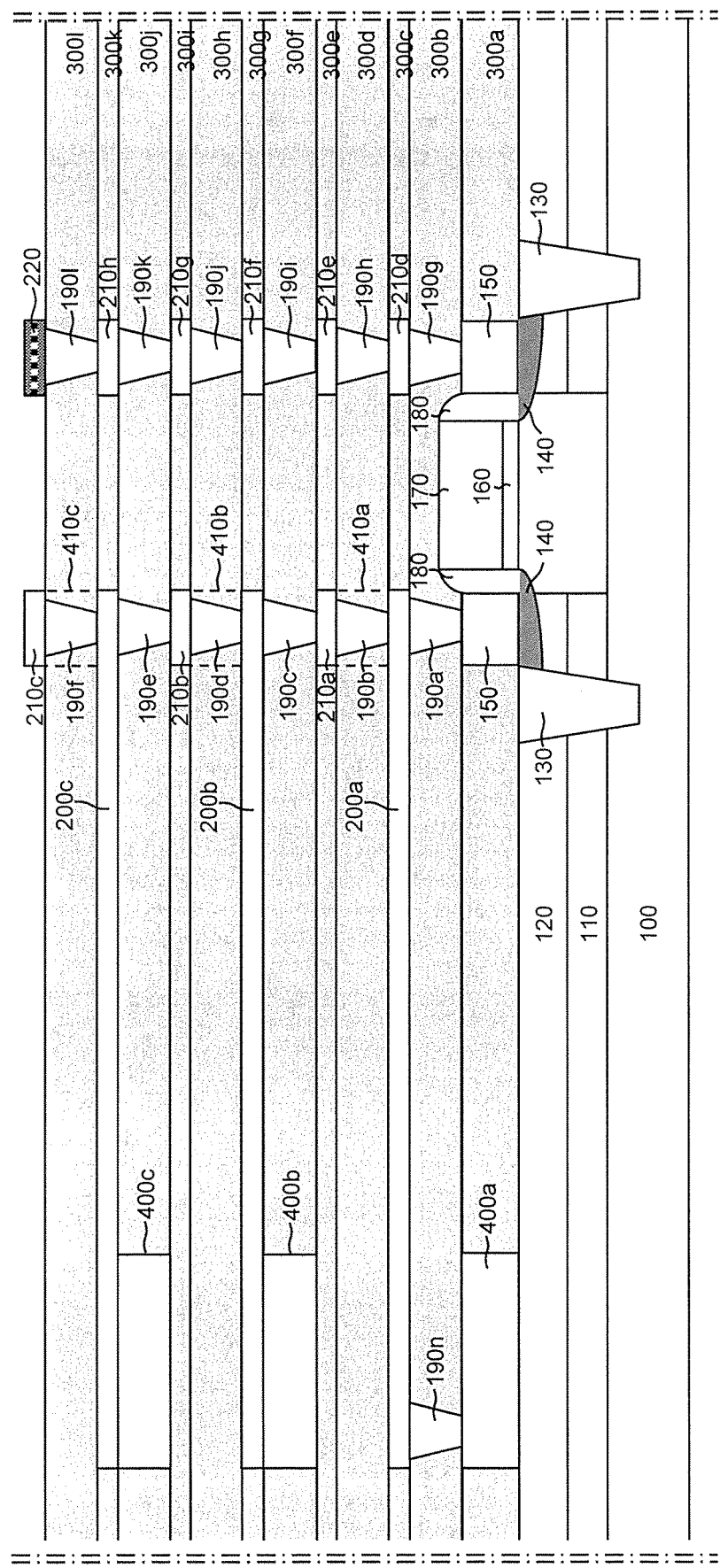
FIG. 18 shows a cross-sectional view of a semiconductor device, according to another embodiment of the present disclosure.

FIG. 18 shows a cross-sectional view of a semiconductor device, according to another embodiment of the present disclosure. In FIG. 18, controlling devices 400a, 400b and 400c are formed and connected to the metal layers 200a, 200b and 200c, respectively, to apply varied control to voltages applied to the source region. In some embodiments, each of the controlling devices 400a, 400b and 400c applies a same voltage to the source region 140. In some embodiments, each of the controlling devices 400a, 400b and 400c applies a different or the same voltage to the source region. Although hidden in the view of FIG. 18, controlling devices 410a, 410b, and 410c (outlined by broken lines) connect with metal layers 210a, 210b, and 210c, respectively, to apply varied control to voltages applied to the source region. The combined voltage of the voltages applied controls the source region 140 and the transistor portion. In the embodiment in FIG. 18, the drain region 140 does not have any controlling device connected to the metal layers 210d, 210e, 210f, 210g, and 210h. In this way, the controllability of the controlled device 220 can be further enhanced through the vertical structure while reducing the surface area of the substrate 100.

Figure 19:
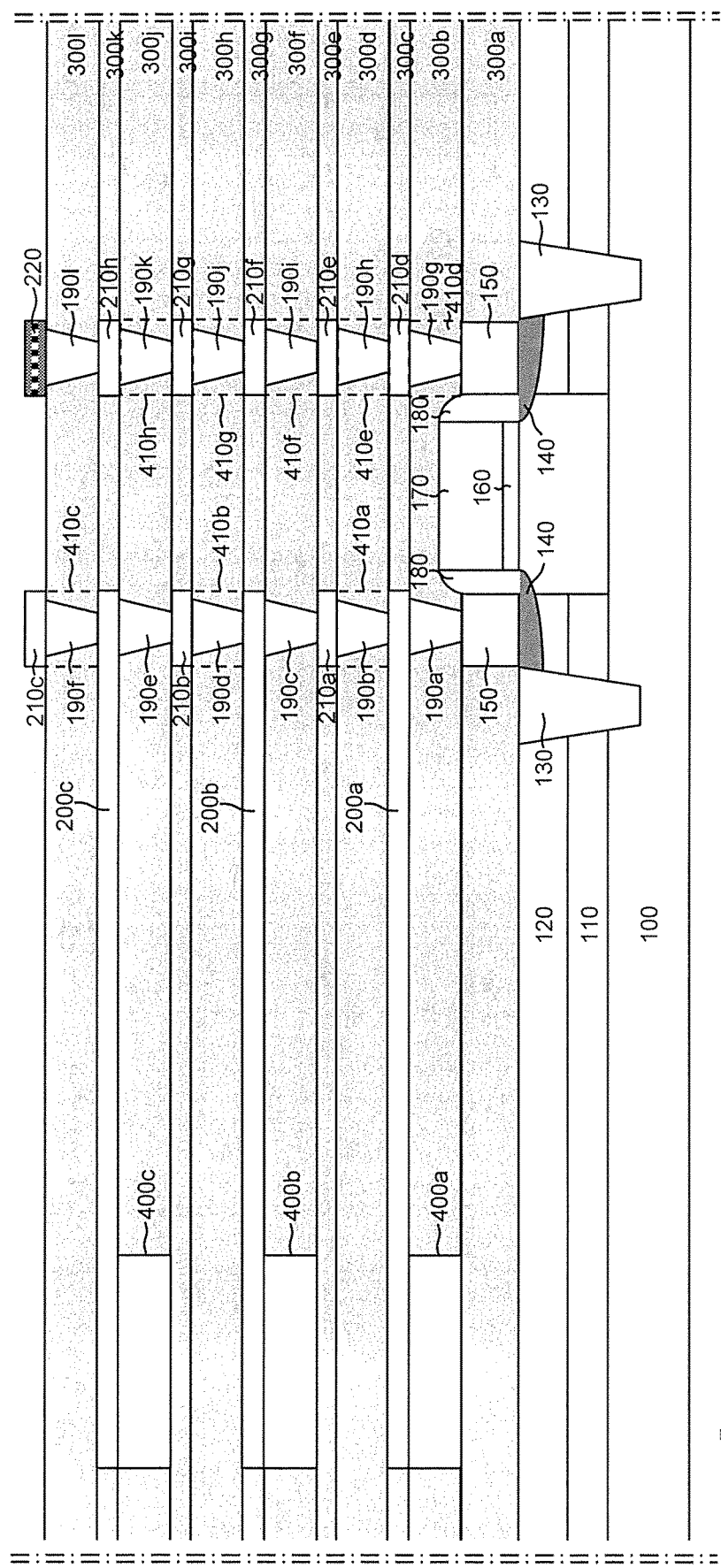
FIG. 19 shows a cross-sectional view of a semiconductor device, according to another embodiment of the present disclosure.

FIG. 19 shows a cross-sectional view of a semiconductor device, according to another embodiment of the present disclosure. The semiconductor device in FIG. 19 is similar to the embodiment in FIG. 18, except the end portions of the metal layers 210d, 210e, 210f, 210g, and 210h opposite to the stacked vias are connected to controlling devices 410d, 410e, 410f, 410g, and 410h, respectively, so as to receive the same or different voltages from the controlling devices 410d, 410e, 410f, 410g, and 410h. In this way, the controllability of the controlled device 220 can be further enhanced through the vertical structure while reducing the surface area of the substrate 100. The controlling devices indicated by broken lines are located the end portions of the metal layers away from the vias, and the broken lines are used to indicate the overlapping positions of the controlling devices along y axis.

Figure 20:
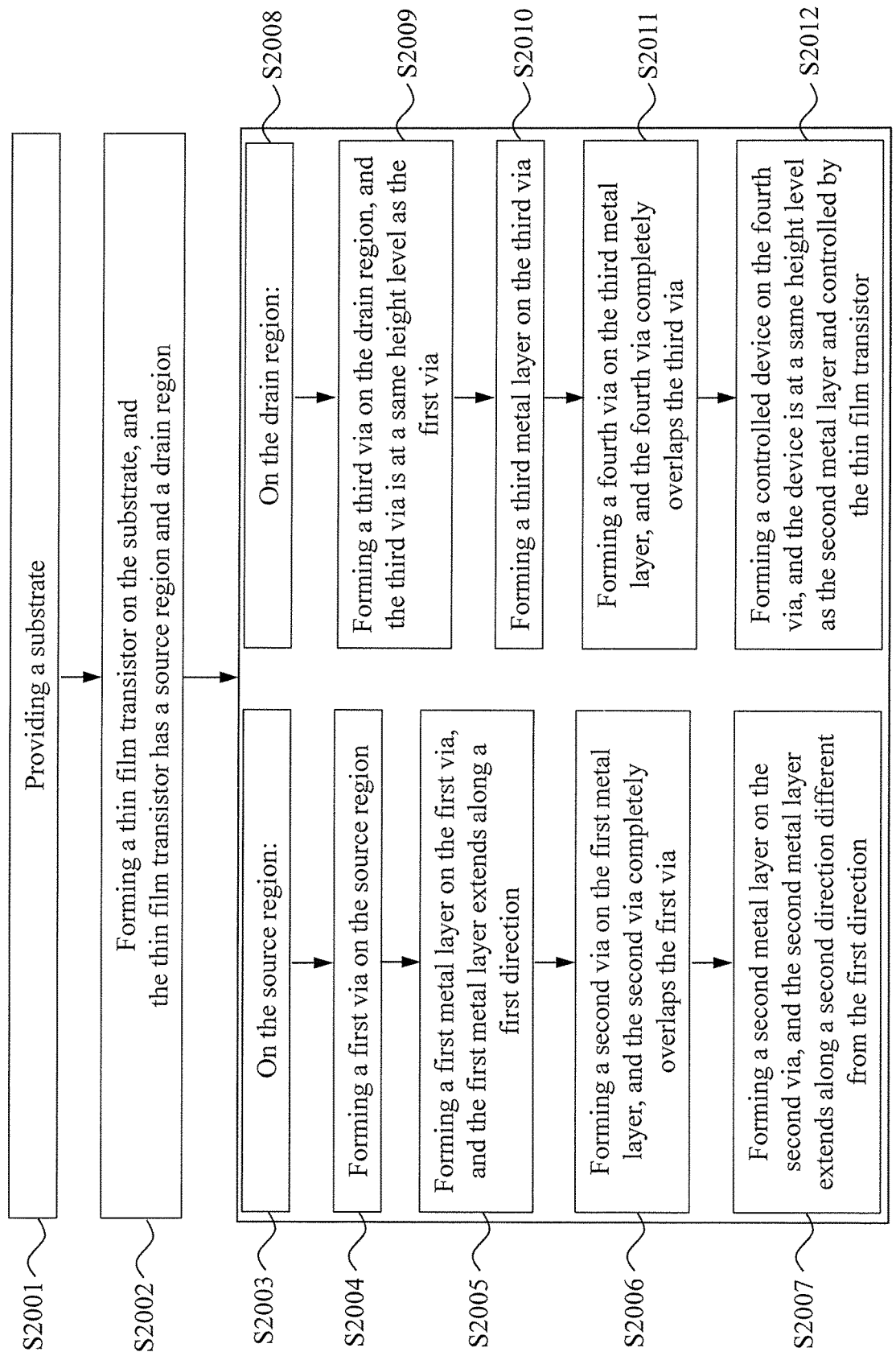
FIG. 20 shows a method of forming the semiconductor device in FIG. 1, according to embodiments of the present disclosure.

FIG. 20 shows a flow chart of a method of forming the semiconductor device in FIG. 1, according to embodiments of the present disclosure. The method includes operations S2001: providing a substrate, S2002: forming a thin film transistor having a source region and a drain region on the substrate. After operation S2002, two sets of operations S2003-S2007 and S2008-S2012 are performed on the source region and the drain region, either simultaneously on both the source and drain regions, or separately in a sequence of finishing the sequence on the source region and then finishing the sequence on the drain region. That is, the method includes, at S2003 (i.e. on the source region), operations of S2004: forming a first via on the source region, S2005: forming a first metal layer extending along a first direction on the first via, S2006: forming a second via completely overlapping the first via on the first metal layer, and S2007: forming a second metal layer extending along a second direction different from the first direction on the second via. The method also includes, at S2008 (i.e. on the drain region), operations of S2009: forming a third via at the same height level as the first via on the drain region, S2010: forming a third metal layer on the third via, S2011: forming a fourth via completely overlapping the third via on the third metal layer, and S2012: forming a controlled device on the fourth via, and the device is at the same height level as the second metal layer and controlled by the thin film transistor.

Figure 21:
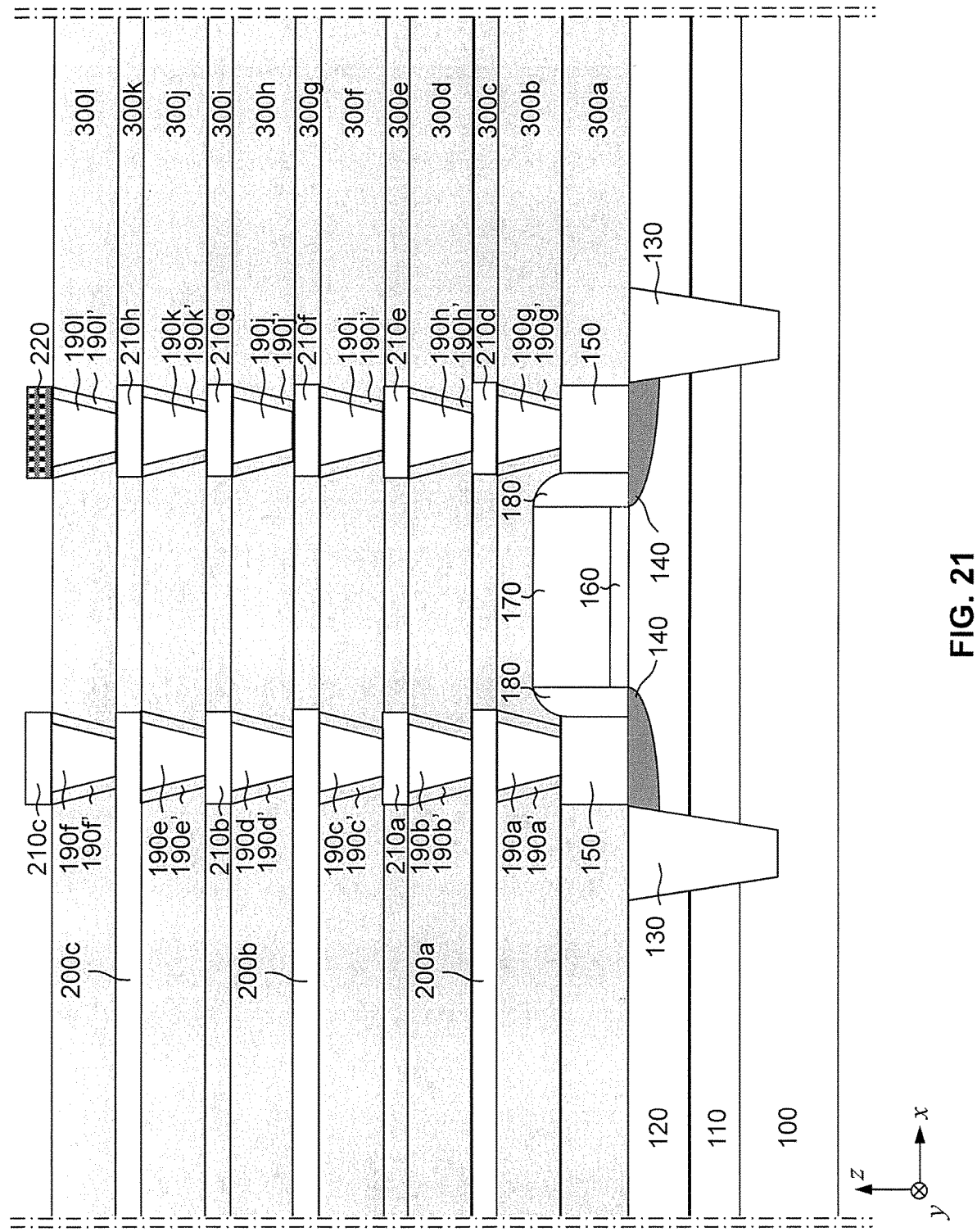
FIG. 21 shows a cross-sectional view of a semiconductor device, according to an embodiment of the present disclosure.

FIG. 21 shows a semiconductor device having a vertical routing structure, according to an embodiment of the present disclosure. In some embodiments, the semiconductor device includes a transistor portion. In some embodiments, the transistor portion includes a planar transistor. In some embodiments, the transistor portion includes a surrounding gate transistor or a FinFET. For a demonstration purpose, a planar transistor (FET) is shown in FIG. 21 as an example. The transistor portion is formed on a substrate 100. In some embodiments, the substrate 100 includes a single crystalline semiconductor layer on at least its surface portion. In some embodiments, the substrate 100 includes a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline silicon.

In FIG. 21, the semiconductor device includes a buffer layer 110. In some embodiments, the buffer layer 110 is a SiGe layer or an oxide layer such as silicon oxide, titanium oxide, molybdenum oxide, zinc oxide, indium oxide, tungsten oxide, magnesium oxide, calcium oxide, tin oxide, or the like. In some embodiments, the buffer layer 110 has a function of adjusting the stress and strain of a layer formed over it. In some embodiments, the buffer layer 110 prevents leakage current passed from a layer formed over it to other devices formed on the substrate 100.

In FIG. 21, the semiconductor device also includes a first well layer 120, a part of which is used for a channel for charge carrier transport in the transistor portion. In some embodiments, the first well layer 120 is formed of a semiconducting material such as crystalline silicon and germanium. The first well layer 120 is disposed on the buffer layer 110 on the substrate 100. The first well layer 120 includes diffusion regions 140 as source and drain regions (hereinafter, for demonstration purpose, the left diffusion region 140 is assigned as source region and the right diffusion region 140 is assigned as drain region of the transistor portion; and one of ordinary skill in the art would understand that the left and right diffusion regions 140 can be drain and source regions, respectively, of the transistor). The diffusion regions 140 are formed by doping the first well layer 120 by using an ion implantation method. The transistor portion further includes an isolation insulating layer 130 which is also called a shallow trench isolation (STI) layer. The isolation insulating layer 130 is made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, and combinations of these.

The transistor portion further includes second semiconductor layers 150 disposed on the source and drain regions 140.

Between the source and drain regions 140, the transistor portion includes a gate stack which is formed of a gate dielectric layer 160 on channel region of the first well layer 120 between the source and drain regions 140, and a gate electrode layer 170. In some embodiments, the gate electrode layer 170 is a single layer or multilayer structure. In some embodiments, the gate electrode layer 170 is poly-silicon. Further, the gate electrode layer 170 is doped poly-silicon with uniform or non-uniform doping, in some embodiments. In some alternative embodiments, the gate electrode layer 170 includes a metal, such as Al, Cu, W, Ti, Ta, TiN, TiAl, TiAlN, TaN, NiSi, CoSi, other conductive materials with a work function compatible with the substrate material, or combinations of these. In the present embodiment, the gate electrode layer 170 has a thickness in a range of about 20 nm to about 100 nm.

In some embodiments, the gate dielectric layer 160 includes silicon oxide, silicon nitride, silicon oxy-nitride, or high-k dielectrics. The high-k dielectrics include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In the present embodiment, the gate dielectric layer 160 is a high-k dielectric layer with a thickness in the range of about 1 to about 5 nm. In some embodiments, the gate dielectric layer 160 further includes an interfacial layer (not shown) to reduce damage between the gate dielectric layer 160 and channel of the first well layer 120. The interfacial layer includes chemically formed silicon oxide in some embodiments.

The gate stack is surrounded by sidewall spacers 180 which separate the gate stack from the source and drain regions 140. The sidewall spacers 180 include one or more of SiN, SiON, SiCN, SiCO, SiOCN or any other suitable dielectric material.

The transistor portion is covered by first interlayer dielectric (ILD) layers 300a, 300b, 300d, 300f, 300h, 300j, and 300l in which through holes are formed respectively, and vias 190a, 190b, 190c, 190d, 190e, 190f, 190g, 190h, 190i, 190j, 190k, and 190l surrounded by protective layers 190a', 190b', 190c', 190d', 190e', 190f', 190g', 190h', 190i', 190j', 190k', and 190l' respectively formed by filling the protective layer coated through holes with a conductive material. In some embodiments, the protective layers 190a', 190b', 190c', 190d', 190e', 190f', 190g', 190h', 190i', 190j', 190k', and 190l' are formed of a material such as titanium nitride or tantalum nitride. The protective layers function as a barrier layer to prevent diffusion of a material into the vias surrounded by the protective layers that contaminate the vias and affect the pre-designed resistances of the vias, and prevent diffusion of conducting material to the ILD layers that create leakage current pathways. In some embodiments, the protective layers 190a', 190b', 190c', 190d', 190e', 190f', 190g', 190h', 190i', 190j', 190k', and 190l' are formed by an electro-plating method such as CVD, MOCVD, and conformal physical vapor deposition method. In some embodiments, the vias are formed of an electrically conducting material including one or more of Co, Ni, W, Ti, Ta, Cu, Al, Mo, TiN, TaN, WSi$_2$, Ni—Si, Co—Si, WN, TiAlN, TaCN, TaC, TaSiN, metal alloys such as Ti—Al alloy, Al—Cu alloy, other suitable materials, and/or combinations thereof. In some embodiments, the conductive material is deposited using chemical vapor deposition (CVD), atomic layer deposition (ALD), electro-plating, or physical vapor deposition (PVD) followed by an optional reflow process, or other suitable film formation process.

The materials for the first ILD layers 300a, 300b, 300d, 300f, 300h, 300j, and 300l include inorganic compounds comprising Si, O, C and/or H, such as silicon oxide, SiCOH and SiOC, or organic materials, such as polymers.

The transistor portion is also covered by second interlayer dielectric (ILD) layers 300c, 300e, 300g, 300i, and 300k in which trenches are formed by patterning the second ILD layers 300c, 300e, 300g, 300i, and 300k, respectively. Metal layers 200a, 200b, 200c, 210a, 210b, 210c, 210d, 210e, 210f, 210g, and 210h are formed by filling the trenches with a conductive material. In some embodiments, the metal layers 200a, 200b, 200c, 210a, 210b, 210c, 210d, 210e, 210f, 210g, and 210h are formed of an electrically conducting material including one or more of Co, Ni, W, Ti, Ta, Cu, Al, Mo, TiN, TaN, WSi$_2$, Ni—Si, Co—Si, WN, TiAlN, TaCN, TaC, TaSiN, metal alloys such as Ti—Al alloy, Al—Cu alloy, other suitable materials, and/or combinations thereof. In some embodiments, the conductive material is deposited using chemical vapor deposition (CVD), atomic layer deposition (ALD), electro-plating, or physical vapor deposition (PVD) followed by an optional reflow process, or other suitable film formation process. In some embodiments, the trenches for the metal layers 200a, 200b, 200c, 210a, 210b, 210c, 210d, 210e, 210f, 210g, and 210h are patterned in the second ILD layers 300c, 300e, 300g, 300i, and 300k before filling the through holes to form the vias 190a, 190b, 190c, 190d, 190e, 190f, 190g, 190h, 190i, 190j, 190k, and 190l, so that the metal layers 200a, 200b, 200c, 210a, 210b, 210c, 210d, 210e, 210f, 210g, and 210h and the vias 190a, 190b, 190c, 190d, 190e, 190f, 190g, 190h, 190i, 190j, 190k, and 190l are formed at the same time.

The materials for the second ILD layers 300c, 300e, 300g, 300i, and 300k include inorganic compounds comprising Si, O, C and/or H, such as silicon oxide, SiCOH and SiOC, or organic materials, such as polymers, in some embodiments. In some embodiments, the second ILD layers 300c, 300e, 300g, 300i, and 300k are formed of the same material as the first ILD layers 300a, 300b, 300d, 300f, 300h, 300j, and 300l. In some embodiments, the second ILD layers 300c, 300e, 300g, 300i, and 300k are formed of a material different from the first ILD layers 300a, 300b, 300d, 300f, 300h, 300j, and 300l.

In FIG. 21, a controlled device 220 is formed at the same height level as the metal layer 210c. In some embodiments, the controlled device 220 is a semiconductor component such as a light emitting diode, an organic light emitting diode, a memory, and a processor. In some embodiments, the controlled device 220 is a memory cell, such as a magnetic random access memory (MRAM) cell, a phase change random access memory (PCRAM) cell and/or a resistance change random access memory (RRAM) cell.

In FIG. 21, all the vias 190a, 190b, 190c, 190d, 190e, and 190f on the source region 140 overlap each other, forming a vertical routing structure with trenches occupied by the metal layers 200a, 200b, 200c, 210a, 210b, and 210c. In some embodiments, all the vias 190a, 190b, 190c, 190d, 190e, and 190f on the source region 140 completely overlap each other (i.e. the greatest in-plane area in x-y plane of the vias overlapping each other without having any part in the in-plane area of any one of the vias not overlapped).

FIGS. 22, 23, 24, 25, 26, 27, 28, and 29 show sequential manufacturing operations of forming a portion of the semiconductor device in FIG. 21, according to embodiments of the present disclosure. In FIG. 22, a buffer layer 110 is formed on a substrate 100 by a deposition method, such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process such as wet thermal oxidation method. In some embodiments, the buffer layer 110 is a SiGe layer.

In FIG. 23, a first well layer 120 is formed over the substrate 100 by a deposition method, such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process. The first well layer 120 is formed to a thickness to reduce stress/strain in some embodiments. For example, but not limited to, the first well layer 120 is formed to have a thickness of about 2 nm to about 20 nm in some embodiments. The first well layer 120 includes a germanium layer or a silicon layer, in some embodiments. Also, the first well layer 120 is doped by an n-type dopant to increase the charge carrier concentrations, and the n-type dopant includes phosphorus, in certain embodiments. The doping operation can be carried out by in-situ doping during deposition of the first well layer 120 and/or ion implantation. In this way, the first well layer 120 can be a phosphorus doped germanium layer or a phosphorus doped silicon layer. In some embodiments, the buffer layer 110 is not formed, and the substrate 100 is partially doped with appropriate dopant, thereby forming a well layer 120.

In FIG. 24, shallow trench isolation (STI) layers, which are also called isolation insulating layers 130, are formed through an etching process, a film forming process, such as CVD, flowable CVD (FCVD), or a spin-on-glass process, and a planarization process, such as chemical mechanical polishing, although any acceptable process may be utilized.

In FIGS. 25 and 26, a gate stack is formed on the first well layer 120, and the gate stack includes gate dielectric layer 210 and gate electrode layer 220. The gate dielectric layer 210 is formed using a suitable process such as physical vapor deposition (PVD), chemical vapor deposition (CVD), atomic layer deposition (ALD), thermal oxidation, UV-ozone oxidation, or combinations thereof. The gate electrode layer 220 can be formed by using CVD, including LPCVD and PECVD, PVD, ALD, or other suitable process. The formed gate electrode layer 220 and the gate dielectric layer 210 are patterned by photolithographic and etching methods. In some embodiments, a gate replacement technology is used.

FIG. 27 shows an operation to form diffusion regions at source and drain regions 140 in the first well layer 120. The diffusion regions are formed by doping the first well layer 120 by ion implantation, and using the gate electrode layer 220 as a mask. The dopant concentration is in a range from about $5 \times 10^{17}$ to about $5 \times 10^{18}$ cm$^{-3}$ in some embodiments.

FIG. 28 shows an operation of forming the sidewall spacer 180 surrounding the gate stack. The sidewall spacer 180 can be formed by ALD or CVD, or any other suitable method and anisotropic etching.

In FIG. 29, in some embodiments, the second semiconductor layer 150 is formed on the source and drain regions 140 in the first well layer 120 by a deposition method such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process. The second semiconductor layer 150 is formed to a thickness to apply stress/strain in the structure. For example, but not limited to, the second semiconductor layer 150 is formed to have a thickness of about 2 nm to about 20 nm in some embodiments. The second semiconductor layer 150 includes a SiGe, SiP, SiC, and/or SiCP layer, in some embodiments. Also, the second semiconductor layer 150 is doped by an n-type dopant to increase the charge carrier concentrations, and the n-type dopant includes phosphorus, in certain embodiments. The doping operation can be carried out by in-situ deposition or ion implantation. In this way, the second semiconductor layer 150 can be a phosphorus doped silicon layer. The P doped Si layer can reduce contact resistance at the interface between a metal layer such as via 190a (FIG. 21) and the second semiconductor layer 150.

Figure 30:
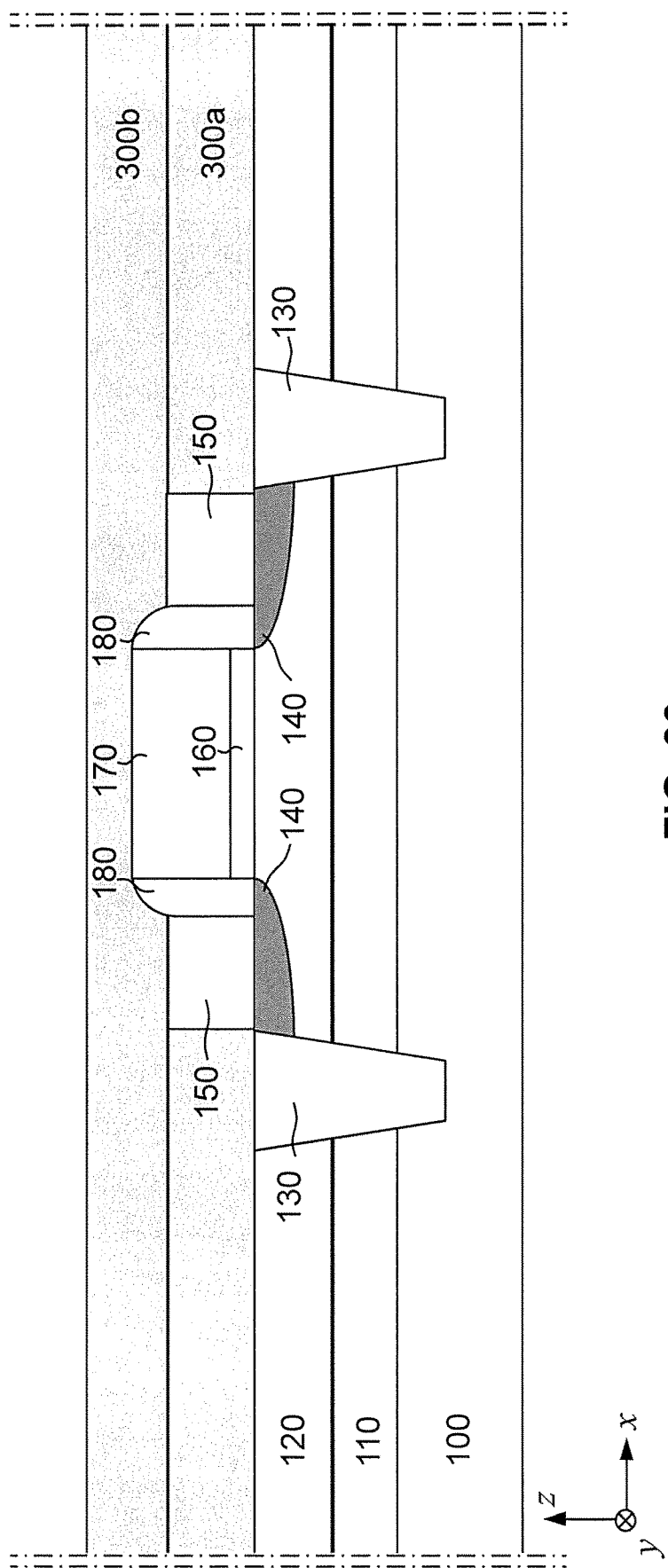
FIGS. 30, 31, 32, 33, 34, and 35 show sequential manufacturing operations of forming the remaining portion of the semiconductor device in FIG. 21, according to embodiments of the present disclosure.

FIG. 30 shows an operation of forming a dielectric structure on the transistor portion and the substrate 100. The operation of forming the dielectric structure is performed using a deposition technique, such as a chemical vapor deposition (CVD) technique or a physical vapor deposition (PVD) technique. In some examples, the operation of forming the dielectric structure includes forming ILD layers 300a and 300b stacked on each other. In some embodiments, the ILD layers 300a and 300b are formed from silicon nitride, silicon carbide or silicon oxide. In some embodiments, the ILD layers 300a and 300b are formed of the same material. In some embodiments, the ILD layers 300a and 300b are formed of different materials. Depending on the materials use to form the ILD layers 300a and 300b, etching rates of the ILD layers 300a and 300b are the same for the ILD layers 300a and 300b formed of the same material, and etching rates of the ILD layers 300a and 300b are different for the ILD layers 300a and 300b formed of the different materials.

Figure 31:
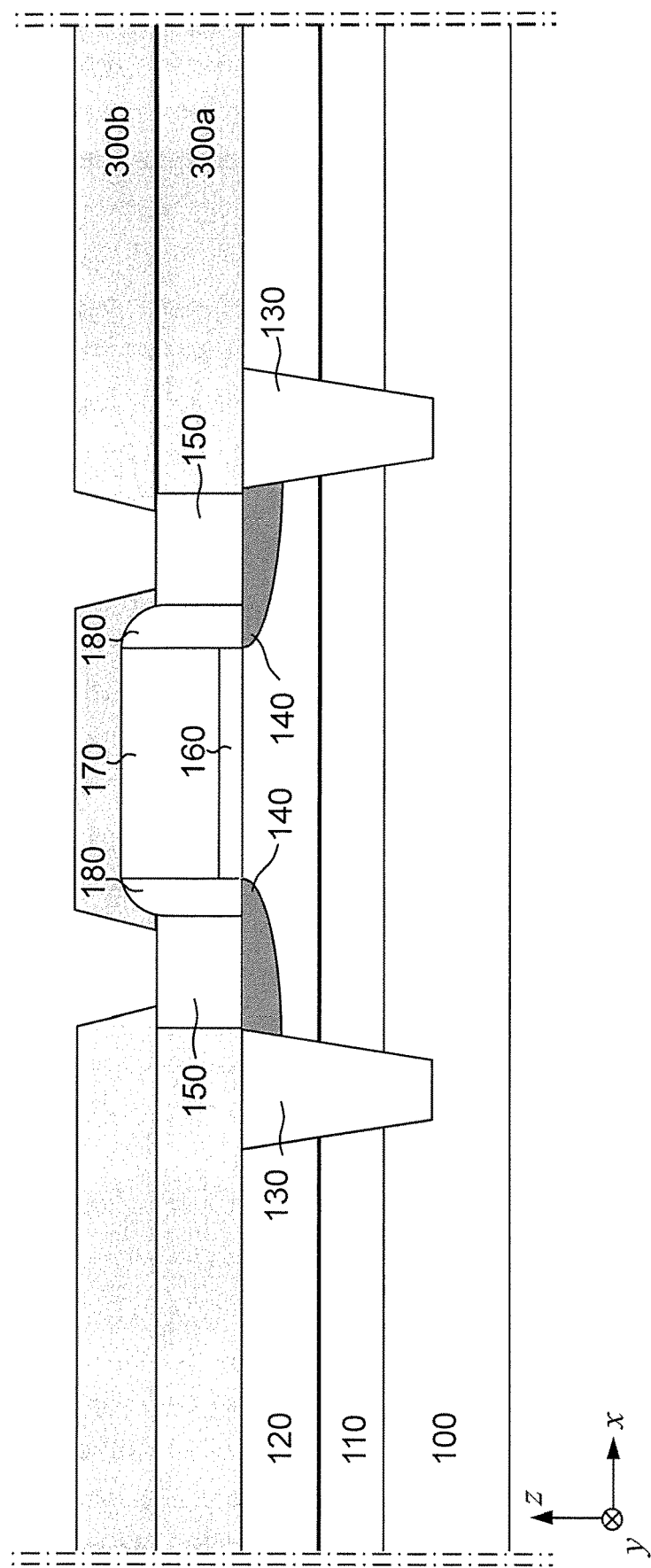
Figure 32:
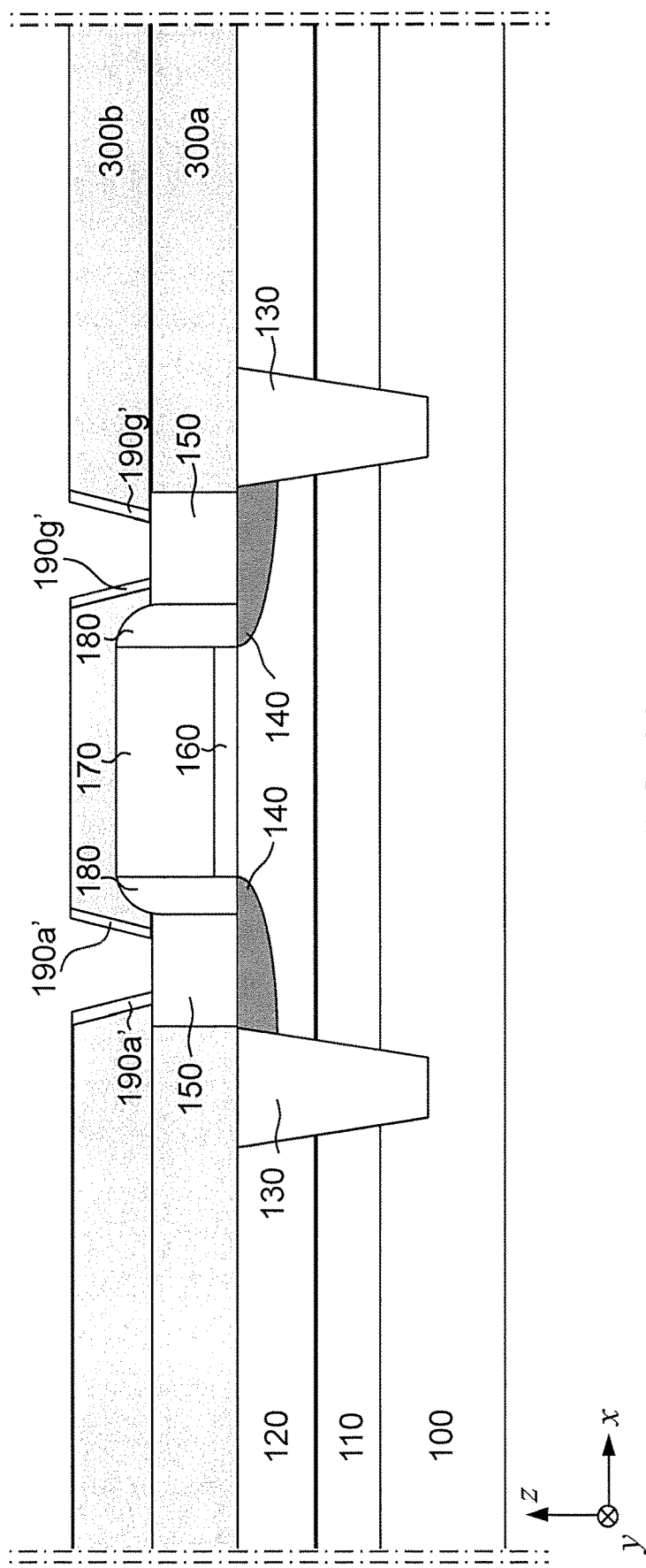
Figure 33:
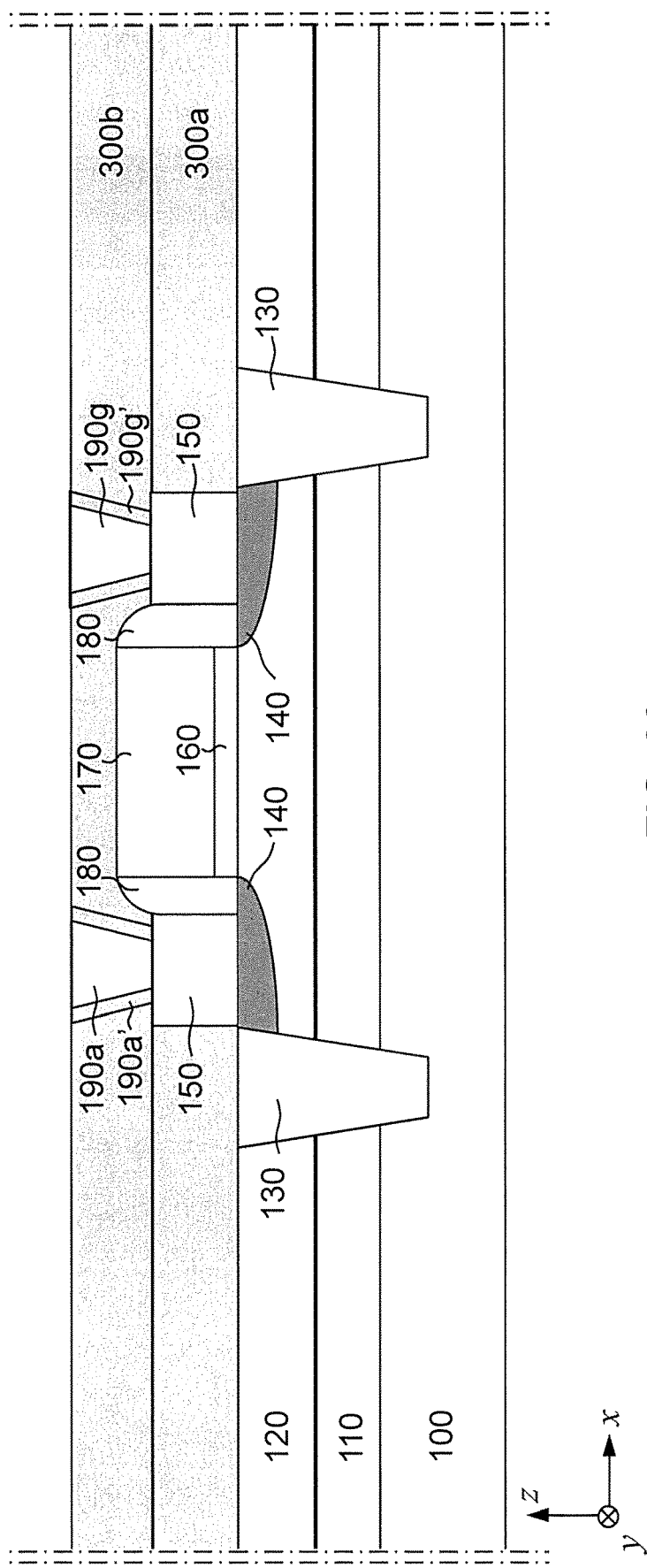

FIGS. 31, 32, and 33 show operations of forming through holes, protective layers 190a' and 190g', and vias 190a and 190g in the ILD layer 300b. In FIG. 31, in some embodiments, the operation of forming the through holes include removing a portion of the ILD layer film 300b using an etching technique, such as a dry etching technique, a photolithographic and etching method, directional etching method, and cyclotron resonance plasma etching.

In FIG. 32, the protective layers 190a', 190b', 190c', 190d', 190e', 190f', 190g', 190h', 190i', 190j', 190k', and 190l' are formed on inside surfaces of the through holes by an electro-plating method such as CVD, MOCVD, and conformal physical vapor deposition method. The protective layers 190a', 190b', 190c', 190d', 190e', 190f', 190g', 190h', 190i', 190j', 190k', and 190l' are formed of a material such as titanium nitride or tantalum nitride.

In FIG. 33, vias 190a and 190g are formed by filling the through holes using a method such as chemical vapor deposition (CVD), including low pressure CVD (LPCVD) and plasma enhanced CVD (PECVD), atomic layer deposition (ALD), non-conformal physical vapor deposition (PVD) such as pulsed laser deposition (PLD), sputtering, evaporative deposition, cathodic arc deposition, e-beam physical vapor deposition, or other suitable process. In some embodiments, the vias 190a and 190g are through vias that completely penetrate the ILD layer 300b. In some embodiments, each of the vias 190a and 190g has a vertical portion penetrating the ILD layer 300b and another vertical portion not penetrating the ILD layer 300b, and in this way, the via 190a or 190g partially penetrates the ILD layer 300b. This structure of the via 190a or 190g functions to adjust the resistance along the vertical axis of the via 190a or 190g so as to fulfill a specific device design for carrying out specific functions of the device for various purposes. In some embodiments, this partially penetrating via structure functions to balance the resistances of the vias 190a and 190g to achieve the same resistance value of the device. In some embodiments, this partially penetrating via structure has different resistances at the source portion 140 and the drain portion 140 to achieve a specific transistor portion for specific purposes.

Figure 34:
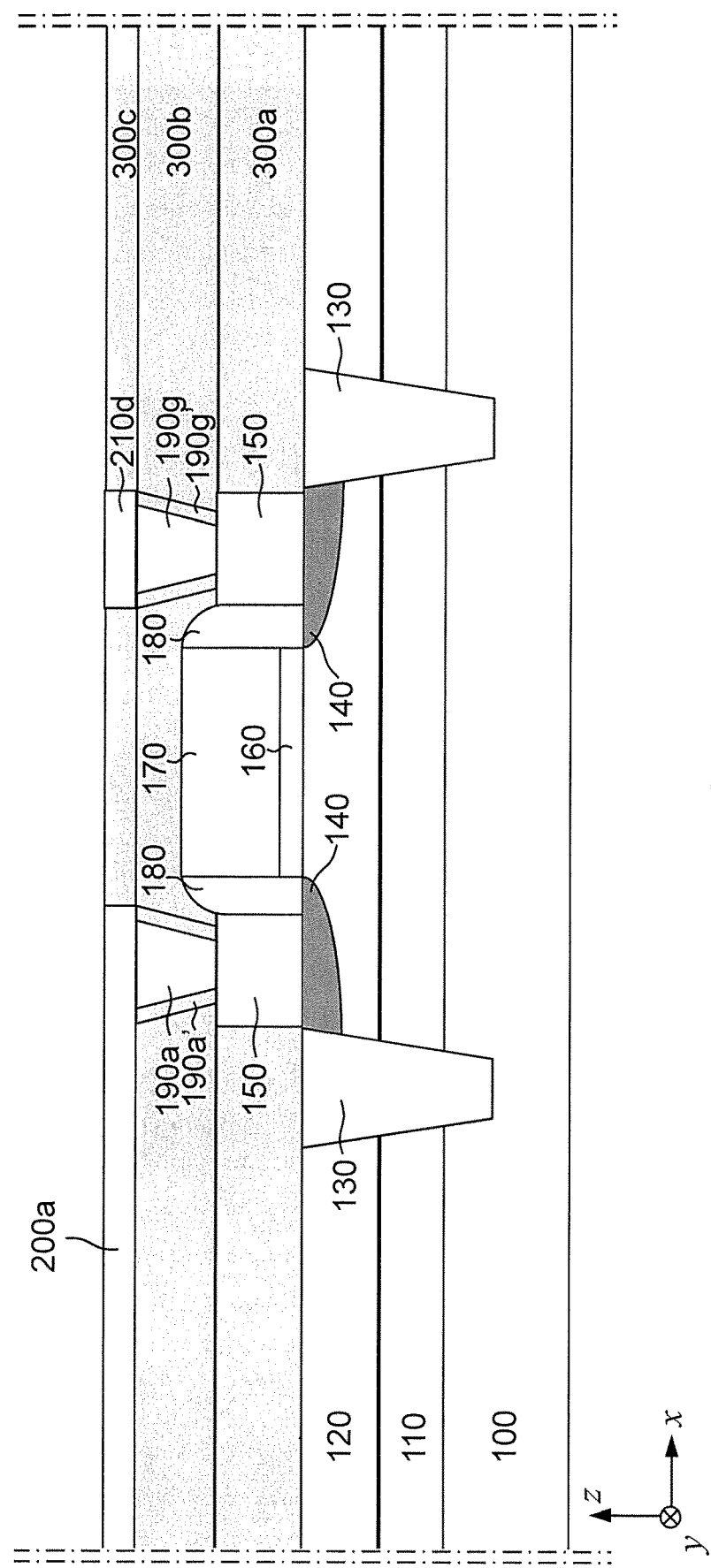

FIG. 34 shows an operation of forming the ILD layer 300c and metal layers 200a and 210d in the ILD layer 300c. The operation of forming the ILD film 300c is performed using a deposition technique, such as a chemical vapor deposition (CVD) technique or a physical vapor deposition (PVD) technique. In some embodiments, the ILD layer 300c is formed from silicon nitride, silicon carbide or silicon oxide. In some embodiments, the ILD layer 300c is formed of the same material as the ILD layer 300b. In some embodiments, the ILD layer 300c is formed of a material different from the ILD layer 300b. Depending on the materials used to form the ILD layers 300c and 300b, etching rates of the ILD layers 300c and 300b are the same for ILD layers 300c and 300b formed of the same material, and etching rates of the ILD layers 300c and 300b are different for the ILD layers 300c and 300b formed of the different materials.

The formed ILD layer 300c is patterned to form trenches to be filled by a metal to form metal layers 200a and 210d. In some embodiments, the patterning technique is a photolithographic and etching method such as DUV photolithography using a mask and plasma etching, or a cyclotron plasma etching method. The operation of forming the trenches includes removing a portion of the ILD layer 300c using an etching technique, such as a dry etching technique, photolithographic and etching methods, directional etching method, and cyclotron resonance plasma etching. Metal layers 200a and 210d are formed by filling the trenches using a method such as chemical vapor deposition (CVD), including low pressure CVD (LPCVD) and plasma enhanced CVD (PECVD), atomic layer deposition (ALD), non-conformal physical vapor deposition (PVD) such as pulsed laser deposition (PLD), sputtering, evaporative deposition, cathodic arc deposition, e-beam physical vapor deposition, or other suitable process. In some embodiments, the metal layers 200a and 210d are formed of a material from among the above described materials used to form the vias 190a and 190g. In some embodiments, the metal layers 200a and 210d are formed of the same material as the vias 190a and 190g. In some embodiments, the metal layers 200a and 210d are formed of a material different from the vias 190a and 190g. In some embodiments, the metal layers 200a and 210d and the vias are formed in the same process in the same processing chamber. In some embodiments, the metal layers 200a and 210d and the vias 190a and 190g are formed in separate processes which are carried out in the same chamber or in different chambers through wafer translation mechanism. In some embodiments, a dual damascene method is applied.

Figure 35:
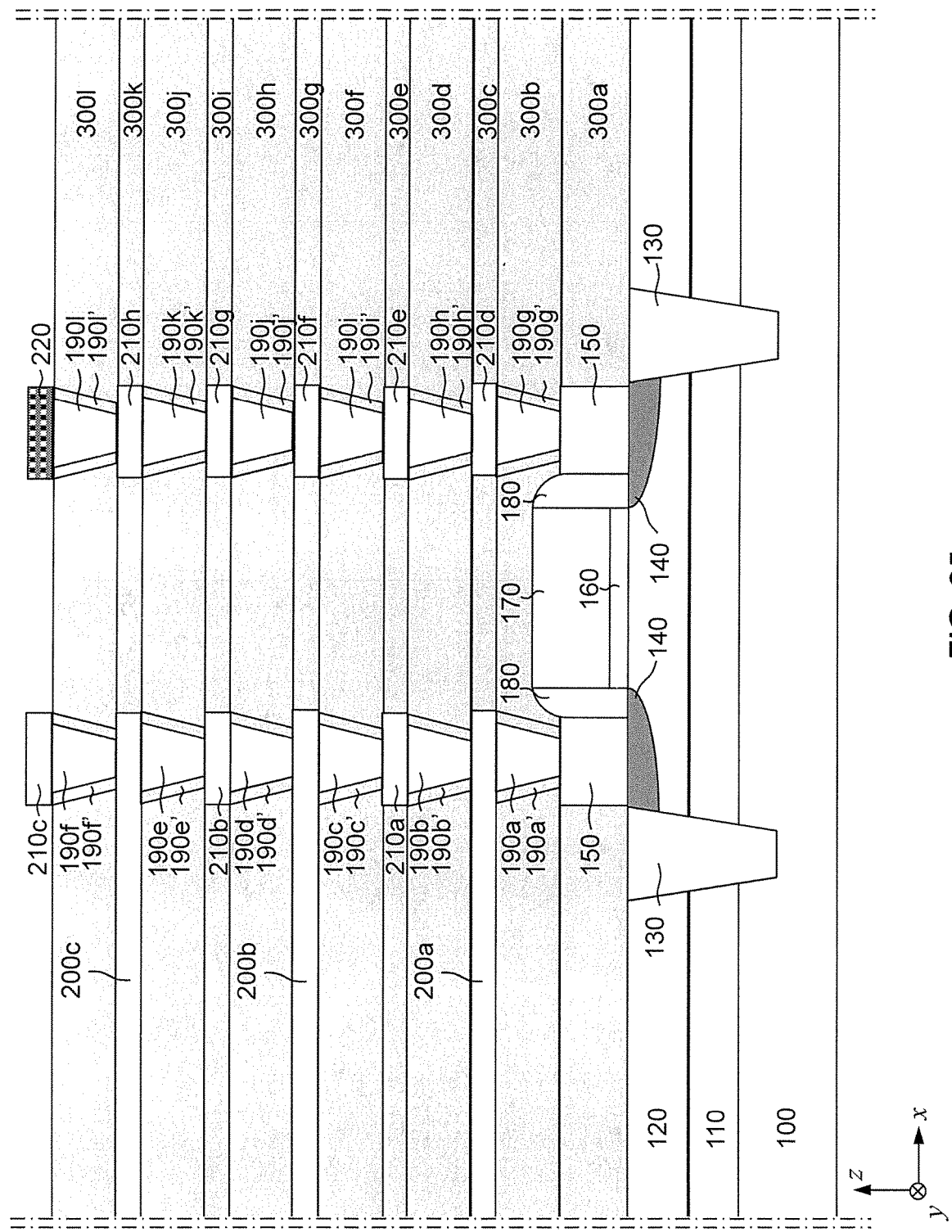

In FIG. 35, the formation of additional ILD layers 300d, 300e, 300f, 300g, 300h, 300i, 300j, 300k, and 300l, the formation of additional vias 190b, 190c, 190d, 190e, 190f, 190h, 190i, 190j, 190k, 190l, and the formation of additional metal layers 200b, 200c, 210a, 210b, 210c, 210e, 210f, 210g, and 210h use the above described operations in FIGS. 30, 31, 32, 33, and 34. In some embodiments, the operations in FIGS. 30, 31, 32, 33, 34, and 35 are carried out in any combination of methods and materials, including same method, different methods, same method for some layers and different methods for some layers, same material and different materials.

In FIG. 35, a controlled device 220 is formed at the same height level as the metal layer 210c. In some embodiments, the controlled device 220 is a semiconductor component such as a light emitting diode, an organic light emitting diode, a memory, and a processor. In some embodiments, the controlled device 220 performs by receiving different voltages applied by the drain region 140 of the transistor portion.

Figure 36:
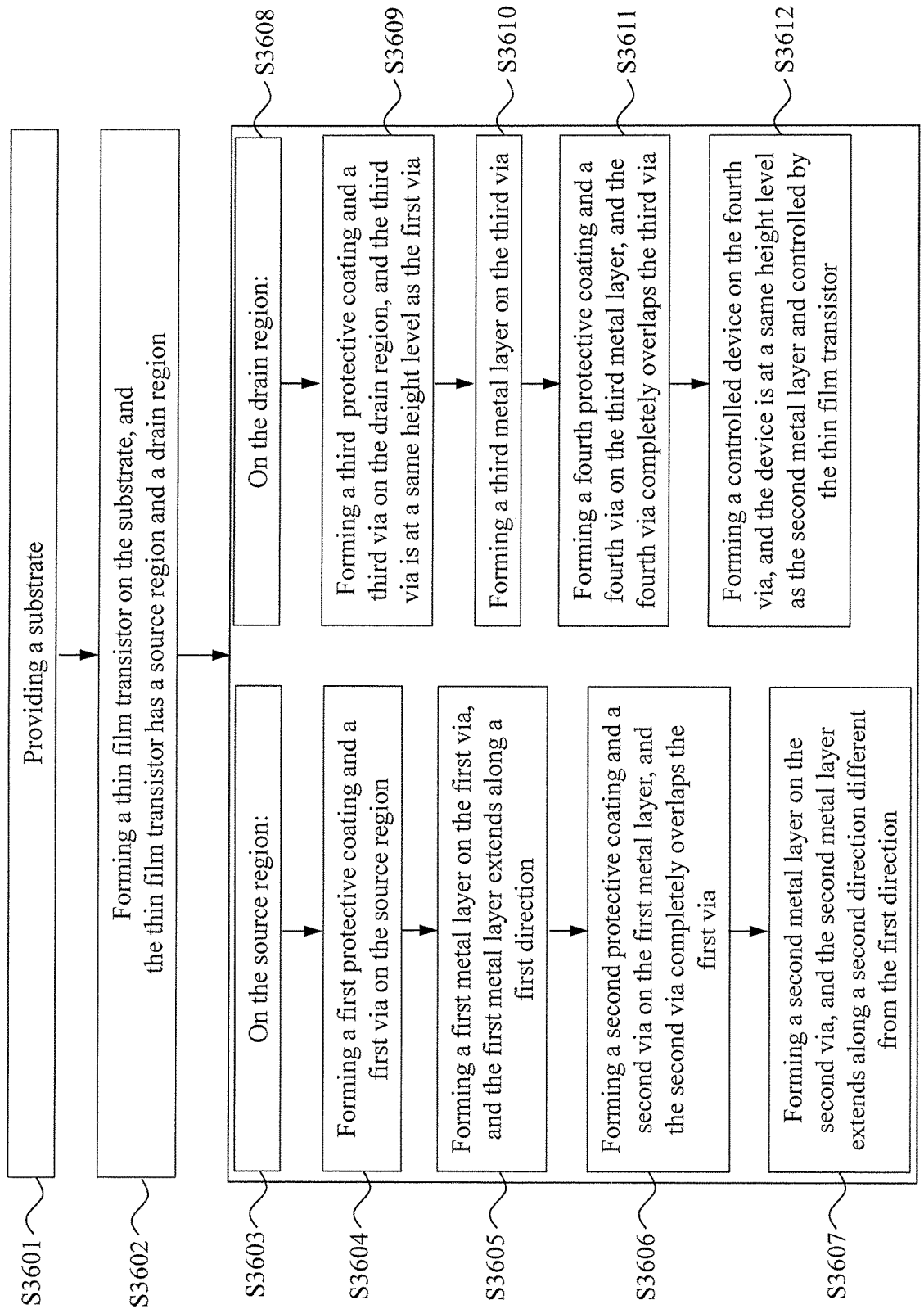
FIG. 36 shows a method of forming the semiconductor device in FIG. 21, according to embodiments of the present disclosure.

FIG. 36 shows a flow chart of a method of forming the semiconductor device in FIG. 21, according to embodiments of the present disclosure. The method includes operations S3601: providing a substrate, S3602: forming a thin film transistor having a source region and a drain region on the substrate. After operation S3602, two sets of operations S3603-S3607 and S3608-S3612 are performed on the source region and the drain region, either simultaneously on both the source and drain regions, or separately in a sequence of finishing the sequence on the source region and then finishing the sequence on the drain region. That is, the method includes, on the source region (S3603), operations of S3604: forming a first protective coating and a first via on the source region, S3605: forming a first metal layer extending along a first direction on the first via, S3606: forming a second protective coating and a second via completely overlapping the first via on the first metal layer, and S3607: forming a second metal layer extending along a second direction different from the first direction on the second via. The method also includes, on the drain region (S3608), operations of S3609: forming a third protective coating and a third via at the same height level as the first via on the drain region, S3610: forming a third metal layer on the third via, S3611: forming a fourth protective coating and a fourth via completely overlapping the third via on the third metal layer, and S3612: forming a controlled device on the fourth via, and the device is at the same height level as the second metal layer and controlled by the thin film transistor.

Along with the evolution of semiconductor integrated circuit (IC) technology, rapid growth of the market and boosted functional density have pushed the IC technology from two-dimensional (2D) thin film technology to three-dimensional (3D) device structure. The 2D aspect of the 3D device structure still poses a problem of occupying substrate area while more and more functional components are packed for highly complicated controls of device components within the IC. For example, controlling multiple voltage levels of a source of a transistor so as to achieve a sophisticated control of a drain of the device, the multiple controlling devices would occupy a large surface area of the substrate. The present disclosure provides a device structure that solves the above problem of 3D device structure and pushes the IC technology to a new level. In particular, the present disclosure provides a semiconductor device having a vertical routing structure and method of producing the device. The semiconductor device enhances the controllability while efficiently reducing the substrate surface area occupied by the device and controlling devices controlling the device. Also, the device enhances complexity of control of the device, pushing the IC technology and functionality to a new high density level and high versatility level.

The present application discloses an exemplary method of manufacturing a semiconductor device. The method includes forming a transistor having a source region and a drain region on a substrate. On the source region, a first via is formed over the source region. A first metal layer is formed extending along a first direction on the first via. A second via is formed overlapping the first via over the first metal layer. A second metal layer is formed extending along a second direction different from the first direction on the second via. On the drain region, a third via is formed at the same height level as the first via and over the drain region. A third metal layer is formed on the third via. A fourth via is formed over the third metal layer. The fourth via overlaps the third via. A controlled device is formed on the fourth via, and the controlled device is at the same height level as the second metal layer and controlled by the transistor. In one or more of the foregoing or following embodiments, the first via and the second via have the same area in a plan view. In one or more of the foregoing or following embodiments, the first metal layer connects to a controlling device which controls an applied voltage to the first metal layer. In one or more of the foregoing or following embodiments, the second metal layer connects to a controlling device which controls an applied voltage to the second metal layer. In one or more of the foregoing or following embodiments, the controlled device includes one of an organic light emitting diode device, a memory and a transistor. In one or more of the foregoing or following embodiments, between the first metal layer and the second via, the method includes alternately forming a plurality of vias and metal layers, and all the plurality of vias have the same shape (or area) and all the plurality of metal layers have the same shape (or area), in plan view.

The present application also discloses an exemplary method of manufacturing a semiconductor device. The method includes forming a transistor having a source region and a drain region over a substrate. On the source region, a first via is formed surrounded by a first protective layer in a first interlayer dielectric (ILD) layer on the source region. A first metal layer is formed extending along a first direction on the first via. A second via is formed overlapping the first via and surrounded by a second protective layer in a second ILD layer over the first metal layer. A second metal layer is formed extending along a second direction different from the first direction on the second via. On the drain region, a third via is formed at the same height level as the first via and surrounded by a third protective layer in the first ILD layer over the drain region. A third metal layer is formed on the third via. A fourth via is formed overlapping the third via and surrounded by a fourth protective layer in the second ILD layer over the third metal layer. A controlled device is formed on the fourth via, the controlled device is at the same height level as the second metal layer and controlled by the transistor. In one or more of the foregoing or following embodiments, the first via and the second via have the same area in a plan view. In one or more of the foregoing or following embodiments, the first and second protective layers are formed of titanium nitride or tantalum nitride. In one or more of the foregoing or following embodiments, the first metal layer connects to a controlling device (400$a$) which controls an applied voltage to the first metal layer. In one or more of the foregoing or following embodiments, the second metal layer connects to a controlling device (400$b$) which controls an applied voltage to the second metal layer. In one or more of the foregoing or following embodiments, the controlled device includes one of an organic light emitting diode device, a memory and a transistor. In one or more of the foregoing or following embodiments, the method further includes, between the first metal layer and the second via, alternately forming a plurality of vias and metal layers, and all the plurality of vias have the same shape (or area) and all the plurality of metal layers have the same shape (or area), in plan view.

The present application discloses an embodiment of a semiconductor device. The semiconductor device includes a transistor having a source region and a drain region. The transistor is formed on the substrate. A first via is disposed over the source region, and a first metal layer extends along a first direction on the first via. A second via overlaps the first via over the first metal layer, and a second metal layer extends along a second direction different from the first direction on the second via. A third via is at the same height level as the first via over the drain region. A third metal layer is disposed on the third via. A fourth via overlaps the third via and over the third metal layer, and a controlled device is disposed on the fourth via. The device is at the same height level as the second metal layer and is controlled by the transistor. In one or more of the foregoing or following embodiments, the first via and the second via have the same area in a plan view. In one or more of the foregoing or following embodiments, the first metal layer connects to a controlling device which controls an applied voltage to the first metal layer. In one or more of the foregoing or following embodiments, the second metal layer connects to a controlling device which controls an applied voltage to the second metal layer. In one or more of the foregoing or following embodiments, the controlled device includes one of an organic light emitting diode device, a memory and a transistor.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a transistor on a substrate, the transistor having a source region and a drain region;
   on the source region:
      forming a first via over the source region;
      forming a first metal layer on the first via, the first metal layer extending along a first direction;
      forming a second via over the first metal layer, the second via overlapping the first via; and
      forming a second metal layer on the second via, the second metal layer extending along a second direction different from the first direction, and on the drain region:
      forming a third via over the drain region, the third via being at a same height level as the first via;
      forming a third metal layer on the third via;
      forming a fourth via over the third metal layer, the fourth via overlapping the third via; and
      forming a controlled device on the fourth via, the controlled device is at a same height level as the second metal layer and is controlled by the transistor.

2. The method of claim 1, wherein the first via and the second via have the same area in a plan view.

3. The method of claim 1, wherein the first metal layer connects to a controlling device which controls an applied voltage to the first metal layer.

4. The method of claim 1, wherein the second metal layer connects to a controlling device which controls an applied voltage to the second metal layer.

5. The method of claim 1, wherein the controlled device includes one of an organic light emitting diode device, a memory and a transistor.

6. The method of claim 1, further comprising:
   between the first metal layer and the second via, alternately forming a plurality of vias and metal layers.

7. The method of claim 6, wherein all the plurality of vias have a same shape (or area) and all the plurality of metal layers have a same shape (or area), in plan view.

8. A method of manufacturing a semiconductor device, the method comprising:
   forming a transistor over a substrate, the transistor having a source region and a drain region;
   on the source region:
      forming a first via surrounded by a first protective layer in a first interlayer dielectric (ILD) layer on the source region;
      forming a first metal layer on the first via, the first metal layer extending along a first direction;
      forming a second via surrounded by a second protective layer in a second ILD layer over the first metal layer, the second via overlapping the first via; and
      forming a second metal layer on the second via, the second metal layer extending along a second direction different from the first direction, and on the drain region:
      forming a third via surrounded by a third protective layer in the first ILD layer over the drain region, the third via being at a same height level as the first via;
      forming a third metal layer on the third via;
      forming a fourth via surrounded by a fourth protective layer in the second ILD layer over the third metal layer, the fourth via overlapping the third via; and
      forming a controlled device on the fourth via, the controlled device is at a same height level as the second metal layer and is controlled by the transistor.

9. The method of claim 8, wherein the first via and the second via have the same area in a plan view.

10. The method of claim 8, wherein the first and second protective layers are formed of titanium nitride or tantalum nitride.

11. The method of claim 8, wherein the first metal layer connects to a controlling device which controls an applied voltage to the first metal layer.

12. The method of claim 8, wherein the second metal layer connects to a controlling device which controls an applied voltage to the second metal layer.

13. The method of claim 8, wherein the controlled device includes one of an organic light emitting diode device, a memory and a transistor.

14. The method of claim 8, further comprising:
    between the first metal layer and the second via, alternately forming a plurality of vias and metal layers.

15. The method of claim 14, wherein all the plurality of vias have a same shape and all the plurality of metal layers have a same shape, in plan view.

16. A method of manufacturing a semiconductor device, the method comprising:
    (i) forming a transistor on a substrate, the transistor having a source region and a drain region;
    (ii) forming an interlayer dielectric layer;
    (iii) forming a source-side via in the interlayer dielectric layer over the source region and a drain-side via in the interlayer dielectric layer over the drain region;
    (iv) forming a source-side metal layer in contact with the source-side via and a drain-side metal layer in contact with the source-side via;
    (v) repeating (ii)-(iv) for at least four times; and
    (vi) forming a controlled device on one of an uppermost source-side via and an uppermost drain-side via formed by (v),
    wherein, between (i) and (ii), the method further comprises:
    forming a semiconductor layer in contact with a sidewall spacer formed on a side face of the gate electrode, the source region and the drain region, the semiconductor layer being made of a second semiconductor material different from a first semiconductor material of the substrate.

17. The method of claim 16, wherein:
    the controlled device is formed on the uppermost drain-side via, and
    at least one of source-side metal layers is coupled to a logic device.

18. The method of claim 17, wherein none of source-side metal layers is coupled to the logic device.

19. The method of claim 16, wherein the controlled device is a memory cell.

20. The method of claim 19, wherein the memory cell is one of a phase change memory cell and a resistance change memory cell.

* * * * *